US011595009B2

(12) United States Patent
Kareppagoudr et al.

(10) Patent No.: US 11,595,009 B2
(45) Date of Patent: Feb. 28, 2023

(54) SLEWING MITIGATION APPARATUS FOR SWITCHED CAPACITOR CIRCUIT

(71) Applicant: Oregon State University, Corvallis, OR (US)

(72) Inventors: Manjunath Kareppagoudr, Corvallis, OR (US); Gabor Temes, Corvallis, OR (US); Jyotindra Shakya, Corvallis, OR (US); Emanuel Caceres, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 0 days.

(21) Appl. No.: 17/388,365

(22) Filed: Jul. 29, 2021

(65) Prior Publication Data

US 2022/0038064 A1 Feb. 3, 2022

Related U.S. Application Data

(60) Provisional application No. 63/059,861, filed on Jul. 31, 2020.

(51) Int. Cl.
*H03F 3/00* (2006.01)
*H03F 1/02* (2006.01)

(52) U.S. Cl.
CPC ........... *H03F 3/005* (2013.01); *H03F 1/0216* (2013.01)

(58) Field of Classification Search
CPC ... H03F 3/005; H03F 1/0216; H03F 2200/264
USPC ..................................................... 330/9, 250
See application file for complete search history.

(56) References Cited

U.S. PATENT DOCUMENTS 7,880,538 B2 * 2/2011 Sharma ................... H03F 3/005
330/9

OTHER PUBLICATIONS

Callewaert, L. et al., "Class AB CMOS amplifiers with high efficiency", in IEEE Journal of Solid-State Circuits, vol. 25, No. 3, pp. 684-691, Jun. 1990.
Castello, R. et al., "A high-performance micropower switched-capacitor filter", in IEEE Journal of Solid-State Circuits, vol. 20, No. 6, pp. 1122-1132, Dec. 1985.
Christen, T., "A 15-bit 140-uW Scalable-Bandwidth Inverter-Based Delta-Sigma Modulator for a MEMS Microphone With Digital Output", in IEEE Journal of Solid-State Circuits, vol. 48, No. 7, pp. 1605-1614, Jul. 2013.
Degrauwe, M. et al., "Adaptive biasing CMOS amplifiers", in IEEE Journal of Solid-State Circuits, vol. 17, No. 3, pp. 522-528, Jun. 1982.
Elshater, A. et al., "Gm-Free Assisted Opamp Technique for Continuous Time Delta-Sigma Modulators", 2019 IEEE International Symposium on Circuits and Systems (ISCAS), Sapporo, Japan, 2019, pp. 1-4.
Enz, C. et al., "Circuit techniques for reducing the effects of op-amp imperfections: autozeroing, correlated double sampling, and chopper stabilization", in Proceedings of the IEEE, vol. 84, No. 11, pp. 1584-1614, Nov. 1996.

(Continued)

*Primary Examiner* — Hieu P Nguyen
(74) *Attorney, Agent, or Firm* — Mughal IP P.C.

(57) ABSTRACT

A slewing mitigation technique is presented where just the right amount of charge is provided at the switching instant to a switch capacitor circuit so that operational transconductance amplifier (OTA) does not need to provide high peak current. This eliminates slewing altogether and allows using OTAs with less static current for the same settling accuracy.

20 Claims, 15 Drawing Sheets

(56) References Cited

OTHER PUBLICATIONS

Gönen, B. et al., "A Dynamic Zoom ADC With 109-dB DR for Audio Applications", in IEEE Journal of Solid-State Circuits, vol. 52, No. 6, pp. 1542-1550, Jun. 2017.

Hogervorst, R. et al., "A compact power-efficient 3 V CMOS rail-to-rail input/output operational amplifier for VLSI cell libraries", in IEEE Journal of Solid-State Circuits, vol. 29, No. 12, pp. 1505-1513, Dec. 1994.

Honarparvar, M., "A 0.9-V 100-uW Feedforward Adder-Less Inverter-Based MASH Delta-Sigma Modulator With 91-dB Dynamic Range and 20-kHz Bandwidth", in IEEE Transactions on Circuits and Systems I: Regular Papers, vol. 65, No. 11, pp. 3675-3687, Nov. 2018.

Huang, H. et al., "A fast settling CMOS operational amplifier", Proceedings of the 2003 International Symposium on Circuits and Systems, 2003. ISCAS '03., Bangkok, 2003.

Kareppagoudr, M. et al., "Passive slew rate enhancement technique for Switched-Capacitor Circuits", 2019 IEEE 62nd International Midwest Symposium on Circuits and Systems (MWSCAS), Dallas, TX, USA, 2019, pp. 913-916.

Klinke, R. et al., "A very-high-slew-rate CMOS operational amplifier", in IEEE Journal of Solid-State Circuits, vol. 24, No. 3, pp. 744-746, Jun. 1989.

Lee, B. et al., "A high slew-rate CMOS amplifier for analog signal processing", in IEEE Journal of Solid-State Circuits, vol. 25, No. 3, pp. 885-889, Jun. 1990.

Lee, K. et al., "Low-distortion switched-capacitor filter design techniques", in IEEE Journal of Solid-State Circuits, vol. 20, No. 6, pp. 1103-1113, Dec. 1985.

Lee, S. et al., "A 300-uW Audio Delta-Sigma Modulator With 100.5-dB DR Using Dynamic Bias Inverter", in IEEE Transactions on Circuits and Systems I: Regular Papers, vol. 63, No. 11, pp. 1866-1875, Nov. 2016.

Lopez-Martin, A. et al., "Low-Voltage Super class AB CMOS OTA cells with very high slew rate and power efficiency", in IEEE Journal of Solid-State Circuits, vol. 40, No. 5, pp. 1068-1077, May 2005.

Luo, H. et al., "A 0.8-V 230-µW 98-dB DR Inverter-Based ΣΔ-Modulator for Audio Applications", in IEEE Journal of Solid-State Circuits, vol. 48, No. 10, pp. 2430-2441, Oct. 2013.

Malcovati, P. et al., "An high-swing, 1.8 V, push-pull opamp for sigma-delta modulators", 1998 IEEE International Conference on Electronics, Circuits and Systems. Surfing the Waves of Science and Technology (Cat. No. 98EX196), Lisboa, Portugal, 1998, pp. 33-36 vol. 1.

Martin, K. et al., "Effects of the op amp finite gain and bandwidth on the performance of switched-capacitor filters", in IEEE Transactions on Circuits and Systems, vol. 28, No. 8, pp. 822-829, Aug. 1981.

Meng et al., "Charge compensation technique for switched-capacitor circuits", Electronics Letters, vol. 48, No. 16, pp. 988-990, Aug. 2012.

Montanaro, J. et al., "A 160 MHz 32 b 0.5 W CMOS RISC microprocessor", 1996 IEEE International Solid-State Circuits Conference. Digest of Technical Papers, ISSCC, San Francisco, CA, USA, 1996, pp. 214-215.

Naderi, M. et al., "Operational Transconductance Amplifier With Class-B Slew-Rate Boosting for Fast High-Performance Switched-Capacitor Circuits", in IEEE Transactions on Circuits and Systems I: Regular Papers, vol. 65, No. 11, pp. 3769-3779, Nov. 2018.

Norsworthy, S. et al., "Analog Circuit Design for Delta-Sigma ADCs", in Delta-Sigma Data Converters: Theory, Design, and Simulation, 1st ed., IEEE, 1997, pp. 348-350.

Pavan, S. et al., "Power Reduction in Continuous-Time Delta-Sigma Modulators Using the Assisted Opamp Technique", in IEEE Journal of Solid-State Circuits, vol. 45, No. 7, pp. 1365-1379, Jul. 2010.

Rezaei, M. et al., "Slew rate enhancement method for folded-cascode amplifiers", in Electronics Letters, vol. 44, No. 21, pp. 1226-1228, Oct. 9, 2008.

Schreier, R. et al., "Understanding delta-sigma data converters", Piscataway, NJ, IEEE press, 2005.

Stevens, A., "A high-slew integrator for switched-capacitor circuits", in IEEE Journal of Solid-State Circuits, vol. 29, No. 9, pp. 1146-1149, Sep. 1994.

Sun, J. et al., "Continuously controlled and discrete-level charge pumping techniques implemented in SC integrators", Analog Integrated Circuits and Signal Processing, vol. 100, No. 3, pp. 653-661, Sep. 2019.

Sun, J. et al., "Speed-Up Technique by Pre-Charging Load Capacitor in a SC Residue Circuit", in IEEE Transactions on Circuits and Systems II: Express Briefs, vol. 66, No. 4, pp. 522-526, Apr. 2019.

Temes, G., "Finite amplifier gain and bandwidth effects in switched-capacitor filters", in IEEE Journal of Solid-State Circuits, vol. 15, No. 3, pp. 358-361, Jun. 1980.

Wang, B. et al., "A 550-uW 20-kHz BW 100.8-dB SNDR Linear-Exponential Multi-Bit Incremental Sigma-Delta ADC With 256 Clock Cycles in 65-nm CMOS", in IEEE Journal of Solid-State Circuits, vol. 54, No. 4, pp. 1161-1172, Apr. 2019.

Kareppagoudr, "Switched Capacitor Circuit Techniques for High Performance CMOS Analog Circuits," Dissertation for the degree of Philosophy in Electrical and Computer Engineering, presented Jun. 14, 2021 (74 pages).

* cited by examiner

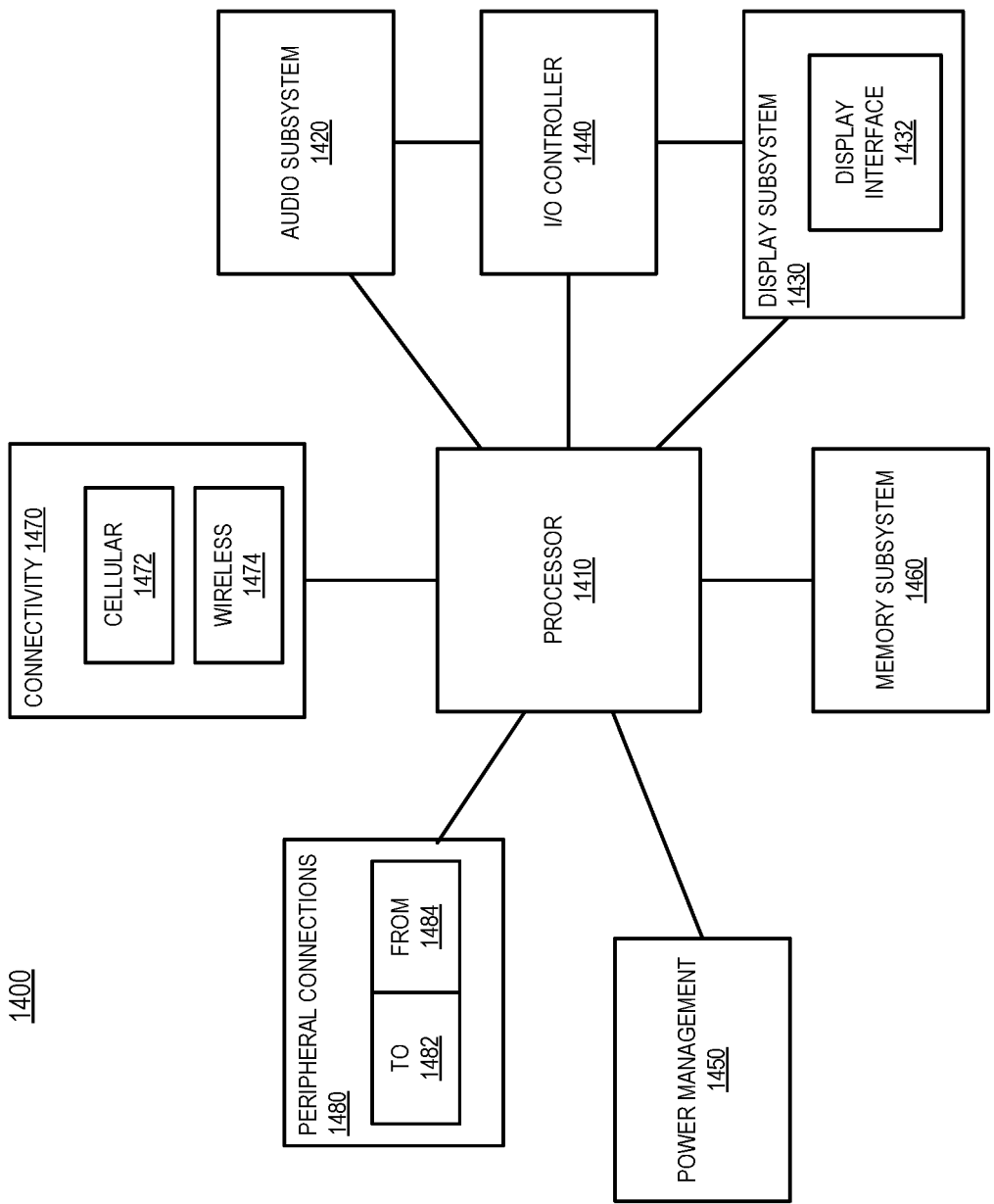

SLEWING MITIGATION APPARATUS FOR SWITCHED CAPACITOR CIRCUIT

CLAIM FOR PRIORITY

This application is a Non-Provisional Application of and claims the benefit of priority to U.S. Patent Application No. 63/059,861, filed on Jul. 31, 2020, titled "SLEWING MITIGATION APPARATUS FOR SWITCHED CAPACITOR CIRCUIT," and which is incorporated by reference in entirety.

GOVERNMENT SUPPORT STATEMENT

The embodiments of this invention were made with support from the United States Government under Task No. 2810-011 awarded by the Semiconductor Research Corporation (Center for Design of Analog and Digital Integrated Circuits (CDADIC)). The Government has certain rights in the invention.

BACKGROUND

Demand for high-speed circuits is increasing for wideband wireless and wireline applications, and high-speed performance is usually achieved at a cost of increasing power consumption. Switched capacitor (SC) circuits are key building blocks in many circuits such as filters, delta-sigma modulators (DSMs), sampling circuits, and sampled-data amplifiers. SC based designs are more tolerant to process variations as critical specifications of such circuits depend on capacitance ratios, which are better controlled than transconductances and resistors.

The SC circuits used in these applications are desired to be highly linear. For example, SC integrators used in delta-sigma analog-to-digital converters (ADCs) should be highly linear to achieve a high signal-to-noise and distortion ratio (SNDR). Most of the time operational transconductance amplifiers (OTAs) are designed to meet high-speed requirements which result in higher cost and higher power consumption. OTAs are designed to meet high-speed requirements at the cost of additional biasing current, which is not used all the time. For example, the time bias current is productively used during slewing time, which is merely a fraction of a total settling time. The bias current is otherwise wasted, resulting in high power consumption.

BRIEF DESCRIPTION OF DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

FIG. 14 illustrates a computer system having a switch-capacitor based passive charge compensation circuit for slewing mitigation, in accordance with some embodiments.

DETAILED DESCRIPTION OF EXEMPLARY EMBODIMENTS

Figure 1A:
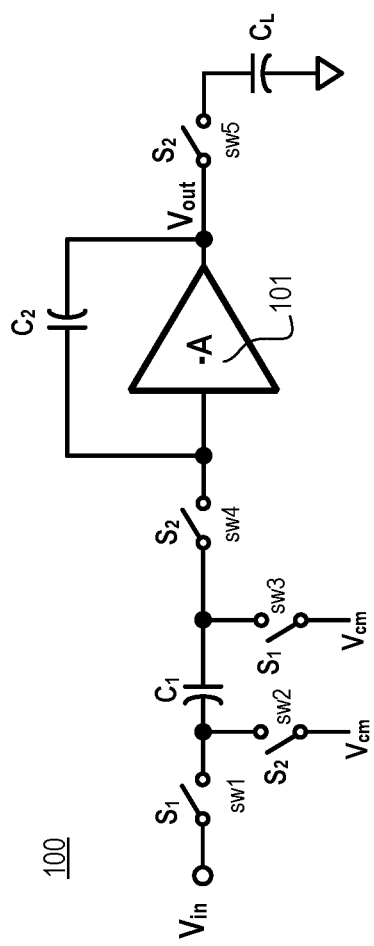
FIG. 1A illustrates a conventional integrator.

In SC circuits, since most of the critical specifications such as gain, Q-factor and corner frequency can be made to depend only on capacitance ratios, even better process tolerance can be achieved. The final settled voltage in each clock phase in SC circuits is important and not how the circuit arrives at such voltage, many circuit techniques can be used to improve circuit imperfections. The static error and dynamic settling error caused by finite gain and bandwidth introduces gain error into transfer function and shifts the pole location. In an SC integrator the shift in pole location away from DC makes the integrator nonideal with a finite gain at DC. In discrete time delta-sigma modulator (DSM), the finite gain on the integrators greatly impacts attainable performance such as suppression of quantization noise. Even in a continuous-time DSM, the finite gain of the first integrator greatly impacts the modulator performance. In addition to these linear effects, however, it is the nonlinear settling caused by slewing that more seriously degrades performance by introducing harmonics.

There are many techniques widely used to improve the settling accuracy in SC circuits. For example, class-AB style operational transconductance amplifiers (OTAs) can be used to improve the settling behavior. However, although there is push-pull current, to not increase the static current too much, there needs to be a fixed voltage (e.g., a battery voltage) across both p-type (e.g., PMOS) and n-type (e.g., NMOS)

devices to set the static current. This in turn limits the maximum current that can be supplied to the load.

Alternatively, adaptive biasing can be used to improve slewing. However, then the output current becomes nonlinearly dependent on the input voltage, which introduces harmonics. There are also other slew-rate enhanced OTAs that sense slewing and provide additional current during slewing. These circuits need additional circuit to sense slewing, and the output current depends nonlinearly on the input voltage, causing distortion. Also, too much additional current can be problematic from the stability point of view and degrade the settling by causing overshoot.

Alternatively, techniques such as assisted operational amplifier (OPAMP) have been proposed where an assistant transconductance block (gm-block) and a digital-to-analog converter (DAC) is used to provide some of the current required during settling. However, the additional blocks require additional power and area. In one example, the assistant gm-block is eliminated, replacing it with a digital filter that provides the DAC with enough information to successfully assist the main OTA, therefore reducing the complexity and power of the assisting circuitry. However, it requires a current sinking circuit that switches from on to off state while providing charge and hence introduces nonlinear distortion.

For discrete-time DSMs, a charge compensation-based slew rate enhancement technique can be used, where a pair of additional capacitors sample the input and inject a proportional current to the OTA output through a current-mirror, relaxing the OTA current.

However, in an SC integrator, the output voltage is the integral of the current fed into the feedback capacitor, and if the current is nonlinear function of input voltage, the final value will also be distorted. Hence, the way to aid without causing nonlinearity is to extend the linear range of output current. This requires increasing the transconductance $g_m$, and hence power.

Some embodiments provide an improved scheme to generate a short current pulse at the beginning of the charge transfer phase, delivering the charge needed by an integrator. Then, an OTA corrects an error in the charge provided, and there no slewing (or substantially zero slewing) as long as this error is small. Based on this principle, a passive charge compensation technique (also referred to as passive charge compensation integrator) is described in accordance with some embodiments, wherein the auxiliary path is simply a capacitor that is switched in such manner that it provides most of the total charge needed from the OTA. The passive charge compensation integrator of some embodiments mitigates slewing in the OTA by providing a controlled amount of charge to the output of the OTA. There are many technical effects of various embodiments. For example, a 12 dB to 15 dB improvement in signal to noise distortion ratio (SNDR) is observed using the passive charge compensation integrator compared to conventional DSM without charge compensation. Other technical effects will be evidenced from the various embodiments and figures.

The embodiments of the disclosure will be understood more fully from the detailed description given below and from the accompanying drawings of various embodiments of the disclosure, which, however, should not be taken to limit the disclosure to the specific embodiments, but are for explanation and understanding only.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1A illustrates integrator 100, which is an example of a SC circuit or integrator (also referred to as a non-inverting delaying SC integrator). Integrator 100 consists of an input node that receives an input voltage Vin, a first set of switches (e.g., sw1 and sw3), a second set of switches (e.g., sw2, sw4, and sw5), and amplifier (OTA) 101, and capacitors $C_1$, $C_2$, and load capacitor $C_L$ coupled as shown. The first set of switches (e.g., sw1 and sw3) are controllable by a first switching signal $S_1$ of a first frequency. The second set of switches (e.g., sw2, sw4, and sw5) are controllable by a second switching signal $S_2$ of the first frequency. The first switching signal $S_1$ is phase offset relative to second switching signal $S_2$ by 180 degrees. The switches can be implemented as transistors, wherein the first switching signal $S_1$ or the second switching signal $S_2$ is received at a gate of a transistor. Here, switches sw2 and sw3 are coupled to a node that receives a common mode voltage (e.g., half of supply voltage).

Figure 1B:
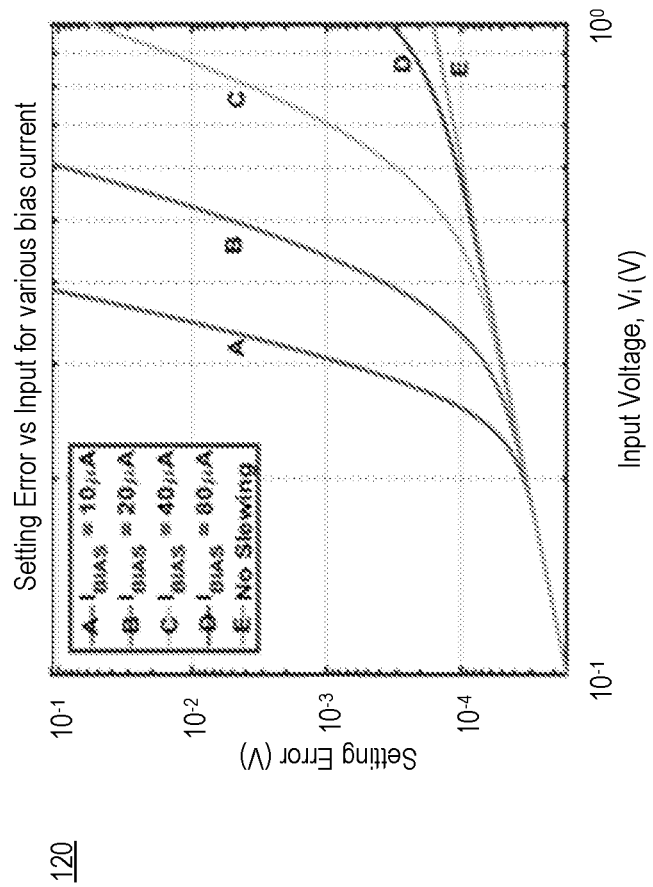
FIG. 1B illustrates a plot showing total error vs. input voltage for various bias current.

FIG. 1B illustrates plot 120 showing total error vs. input voltage $V_{in}$ for various bias current. To emphasize the importance of reducing slewing, its effect on settling error is calculated. The analysis assumes the non-inverting delaying SC integrator of FIG. 1A, with DC gain of 100 dB and an output current limited to $I_{BIAS}$. In an SC circuit with capacitive feedback, such as an integrator, there will be a feedthrough of the input voltage step through the feedback capacitor $C_2$ affecting the output voltage on node $V_{out}$. Integrator 100 needs to settle this feedthrough as well as provide charge to the total load capacitance $C_L$ at the output to bring it to the final voltage. Usually, the feedthrough's polarity is the same as the input step polarity, whereas the signal processed by OTA 101 has to decrease for a positive input step, since integrator 100 is in a negative feedback configuration.

The slew rate for a single-stage OTA is given by:

$$SR = \frac{I_{BIAS}}{C_{LTOT}} \qquad (1)$$

Here, $C_{LTOT}=C_L+\beta \cdot C_1$ is the total load seen by the OTA. $C_1$ is the input capacitor, $C_L$ is the load connected to the output, $$\beta \left( = \frac{C_2}{C_2 + C_1} \right)$$

is the feedback factor, and $C_2$ is the integrating capacitor or feedback capacitor. Whether OTA 101 slews or not may be determined based on the voltage at the input of the OTA ($V_x$). Normally, when $V_x$ is higher than the overdrive voltage by about $\sqrt{2}$, OTA 101 is assumed to be slewing. So, the condition for slewing is:

$$V_x > \sqrt{2} V_{OV} \qquad (2)$$

Based on the input $V_i$ (same as $V_{in}$), the step at the input of OTA 101 can be calculated, assuming OTA 101 does not instantly respond at time t=0. From capacitive charge balance, $$V_x = V_i \frac{C_1}{C_1 + C_2 \| C_L} \qquad (3)$$

The total slewing time is the time required for the virtual ground voltage to return to a value less than $\sqrt{2}V_{OV}$. Since (1) gives the slew rate at the output, the slew rate at the input of OTA 101 is simply $\beta \cdot SR$. The time it takes to achieve this value is:

$$t_{slew} = \frac{V_x - \sqrt{2} V_{OV}}{\beta \cdot SR} \qquad (4)$$

Substituting (1) and (3) into (4), we get:

$$t_{slew} = \frac{V_i \frac{C_1}{C_1 + C_2 \| C_L} - \sqrt{2} V_{OV}}{\beta \frac{I_{BIAS}}{C_L + \beta C_1}} \qquad (5)$$

During this time, OTA 101 is providing constant current at the slew rate SR. So, if the final output voltage needs to change by $\Delta V_O$, at the end of slewing the remaining change left for linear settling is:

$$V_{lin} = \Delta V_o - t_{slew} \cdot SR \qquad (6)$$

Here $\Delta V_O$ is the change in output voltage due to input $V_i$ given by $$\Delta V_o = \frac{C_1}{C_2} V_i = \left(\frac{1}{\beta} - 1\right) V_i \qquad (7)$$

Now the remaining error voltage ($V_{lin}$) must exponentially decay to the static error ($\in_s$) during linear settling. The total error at the end of a charge transfer phase is then given by:

$$\epsilon_t = V_{lin} e^{\frac{-t_{lin}}{\tau}} + \epsilon_s \qquad (8)$$

Here, $t_{lin} = 0.5 t_{clk} - t_{slew}$ and $\in_s$ is the static error. Then the total error is given by:

$$\in_t = ((1/\beta - 1) V_i - t_{slew} \cdot SR) e^{-t_{lin}/\tau} + \in_s \qquad (9)$$

In FIG. 1B equation (9) is plotted assuming $A_0$=70 dB, $F_{UGBW}$=40 MHz, $f_{clk}$=10 MHz, $C_L$=0.5 pF, $C_2$=4 pF, $C_1$=2 pF. From FIG. 1B, the settling error is a linear function of input if there is no slewing. However, when there is slewing, in addition to having a larger error, the error also depends non-linearly on the input voltage. Therefore, slewing mitigation using a charge compensation technique is used for improving linearity, in accordance with some embodiments.

Figure 2:
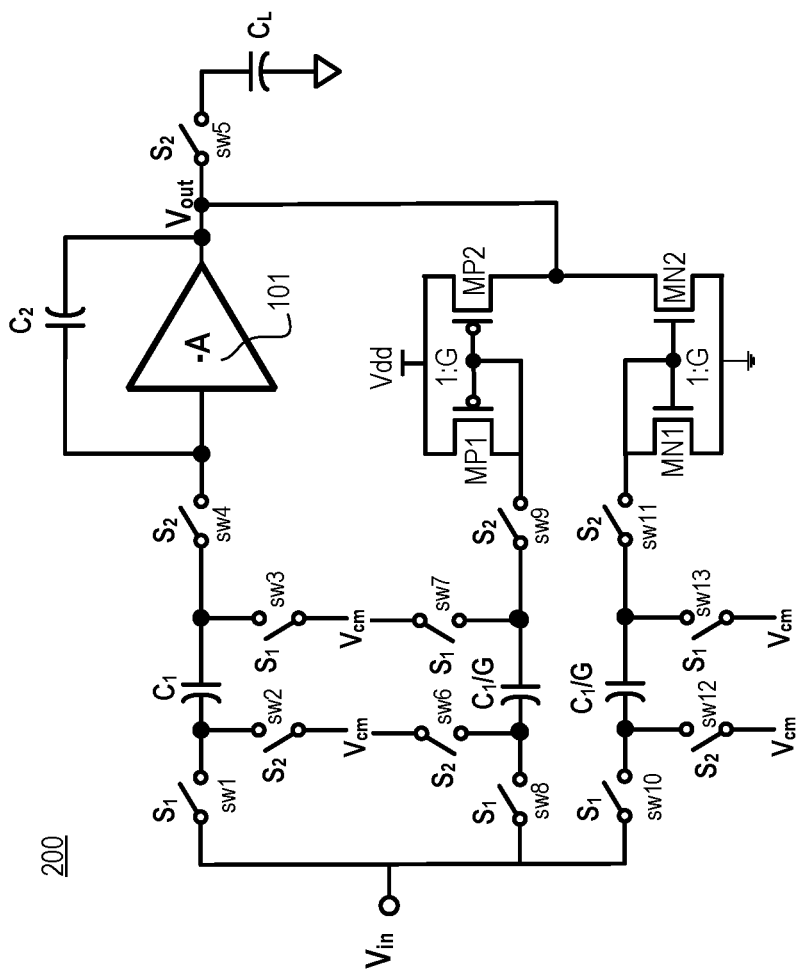
FIG. 2 illustrates a switched capacitor integrated with high-power active charge compensation.

FIG. 2 illustrates switched capacitor circuit 200 integrated with high-power active charge compensation. Here, circuit 200 is a high-power active charge compensation scheme which is referred to an active charge compensation (ACC) scheme. As such, circuit 200 shows an ACC SC integrator. In addition to the components of integrator 100, the ACC SC integrator (or circuit 200) contains switches sw7, sw8, sw10, and sw13 that are part of the first set of switches. Circuit 200 also includes sw6, sw9, sw11, and sw12 that are part of the second set of switches. Circuit 200 includes a pair of auxiliary capacitors of value $C_1/G$, and NMOS and PMOS current mirrors with 1:G ratio, operating in parallel to integrator 100. The PMOS current mirror is formed by p-type transistor MP1 (diode-connected) and p-type transistor MP2. The NMOS current mirror is formed by n-type transistor MN1 (diode-connected) and n-type transistor MN2. The scale factor G allows to keep the area overhead, dominated by capacitors, reasonably small. $S_1$ and $S_2$ are two non-overlapping clock phases. During phase $S_1$, an amount of charge proportional to the input $V_{in}$ is stored in these auxiliary capacitors. During phase $S_2$ the same capacitors are connected to the current mirror input transistors. Provided the voltage on the capacitors $C_1/G$ is above the MOS thresholds, the current mirror will operate in saturation, injecting an amplified current into the output $V_{out}$ of OTA 101. This will progressively discharge the capacitors until their voltage reaches the transistors thresholds, entering in subthreshold region, where the injected current is negligibly small.

Charge compensation takes place at the beginning of $S_2$, where the current mirrors inject a large current that flows through the feedback capacitor $C_2$, quickly reducing the voltage difference between the terminal of OTA 101. Hence the trade-off between bias and slewing current is broken, increasing the power efficiency.

Another active scheme uses pre-charged load capacitor technique applied to a residue-amplifier of the first stage of a pipeline ADC. In this alternative scheme, the slewing time is reduced by injecting charge at the OTA output $V_{out}$ during the amplification phase. In this case, the load capacitor $C_L$, composed of the sampling and feedback capacitors of the residue amplifier of the following pipeline stage, is temporarily removed from the signal path and pre-charged to a voltage set by the input and the reference generated by the DAC, without disturbing the operation of the ADC. Thus, compared to a conventional residue amplifier, in this alternate scheme an extra block is needed to calculate the appropriate voltage, three sets of auxiliary capacitors to avoid interrupting the ADC operation, and additional output latency to pre-charge those capacitors.

In alternative schemes, charge is injected into an integrator's output. Three of such ACC schemes are those that provide the charge from a pulsed current source, differing in the nature of the current amplitude (continuous or discrete with one or three levels) and the pulse duration (fixed or variable). Although active techniques can improve the slew rate, the added active block makes them less attractive in terms of power and linearity improvement.

Various embodiments here describe a passive technique which does not use additional Gm block, or a DAC or a buffer. Some embodiments use the existing buffer (previous stage driver) that drives the input voltage.

Figure 3:
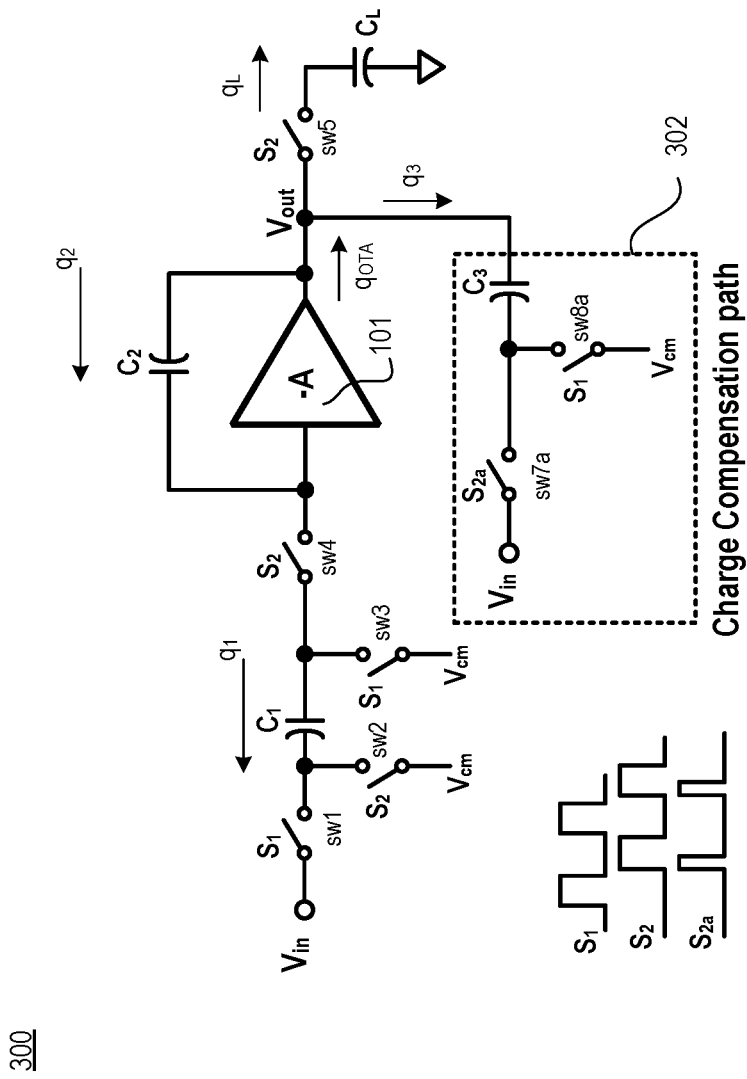
FIG. 3 illustrates a switch-capacitor based passive charge compensation circuit for slewing mitigation, in accordance with some embodiments.

FIG. 3 illustrates a switch-capacitor based passive charge compensation (PCC) circuit 300 for slewing mitigation, in accordance with some embodiments. Circuit 300 is also referred to as PCC integrator 300. In some embodiments, in addition to integrator 100, a charge compensation path or circuit 302 is coupled between the input Vin and the output $V_{out}$. This additional path 302 is added at the output of OTA 101 for charge compensation. In some embodiments, charge compensation path 302 comprises switch sw7a controllable by clock phase $S_{2a}$, switch sw8a controllable by clock phase $S_1$, and capacitor $C_3$. In various embodiments, switch sw8a is coupled to a node that provides common mode voltage ($V_{cm}$). In some embodiments, $V_{cm}$ is substantially half of the supply voltage $V_{dd}$. In some embodiments, the common mode voltage is a programmable voltage. $V_{cm}$ can be generated by any suitable circuit such as voltage divider, resistor divider, bias generation circuit, etc.

In various embodiments, the switches here can be implemented as transistors with gates controllable by the clock phases. These transistors can be an n-type transistor, a p-type transistor, or a combination of them. The capacitors of various embodiments can be implemented using any suitable technique. For example, the capacitors herein can be implemented as Metal-insulator-Metal (MIM) capacitors, ferroelectric based capacitors, metal capacitors, transistors configured as a capacitor, or a combination of them.

Here, $S_1$ and $S_2$ are two non-overlapping clock phases, $S_{2a}$ is on half the time as of $S_2$. During phase $S_1$, the input is sampled onto $C_1$, while the charge compensation capacitor $C_3$ stores the output voltage of the OTA generated in the previous clock phase. During phase $S_2$, OTA 101 provides a charge equal to $C_1 V_{in}$ to the top plate of $C_2$, in addition to charging the load capacitor $C_L$. The total charge that OTA 101 needs to provide during $S_2$ without using the compensation technique is given by:

$$q_{OTA}(n) = C_{LTOT}(V_{out}(n) - V_{out}(n-1)) = C_{LTOT}\frac{C_1}{C_2}V_{in}(n) \quad (10)$$

where $C_{LTOT} = C_2 + C_L$. In the charge compensation technique, an additional charge proportional to the input voltage is provided through capacitor $C_3$. Since the required charge is a linear function of $V_{in}$, $V_{in}$ is used to inject charge at the output $V_{out}$ of OTA 101. The following section introduces a compensating capacitor $C_3$ connected between output $V_{out}$ of OTA 101 and $V_{in}$ as shown in FIG. 3 and solves for the value of $C_3$ required to inject the required charge. During $S_2$ the charge compensation capacitor voltage switches from $V_{out}(n-1)$ to $V_{out}(n) - V_{in}(n)$. Then the total charge delivered by the compensating capacitor is:

$$q_c(n) = C_3(V_{in}(n) - (V_{out}(n) - V_{out}(n-1))) = C_3\left(V_{in}(n) - \frac{C_1}{C_2}V_{in}(n)\right) \quad (11)$$

Now for these to be equal:

$$(C_2 + C_L)\frac{C_1}{C_2} = C_3\left(1 - \frac{C_1}{C_2}\right) \quad (12)$$

$$C_3 = C_1\frac{1 + \frac{C_L}{C_2}}{1 - \frac{C_1}{C_2}} = C_1\frac{C_2 + C_L}{C_2 - C_1} \quad (13)$$

If the input varies slowly (e.g., it is oversampled), OTA 101 can still be greatly relaxed, since only a charge proportional to the difference between the input voltages in two phases needs to be provided. In such a case, the frequency response of the charge needed from OTA 101 due to the input can be reduced from $$C_{LTOT}\frac{C_1}{C_2}$$

to about $$C_3\frac{\pi}{2 \cdot OSR} \quad (14)$$

For reasonably high oversampling ratios (OSR), the required charge from OTA 101 will be much smaller using PCC than using a conventional integrator.

In the case of a fully differential structure, the results herein remain valid. In the case of a non-delayed differential integrator the charge from the OTA can be exactly cancelled by connecting the bottom plate of capacitor $C_3$ to $-V_{in}$ at the same time as when capacitor $C_1$ is connected to $V_{in}$. The optimal value for capacitor $C_3$ is the same as before. There will be no effect (or substantially no effect) of delay and the charge compensation will be more accurate and independent of OSR, in accordance with some embodiments.

Although capacitor $C_3$ provides the correct charge at the output of the OTA, it also acts as additional load during $S_2$, degrading the integrator's bandwidth and hence slowing the residual settling process. However, since most of the charge through capacitor $C_3$ is already transferred at the beginning of $S_2$, it can be disconnected after some time in Sea. The amount of time it needs to be connected depends on switch resistances and hence the behavior of the initial transient, which can be optimized during circuit simulation, in accordance with some embodiments.

In the following derivation, OTA 101 is considered to be ideal. Two non-overlapping clock phases $S_1$ and $S_2$, are assumed, each with a period of $T_S$ and a phase difference of $T_S/2$. $S_2$ is identified with index n and with index n-½. During phase $S_2$, the charge flowing through $C_1$, $q_1(n)$, is equal to the one through $C_2$, $q_2(n)$. Besides, due to negative feedback the bottom plate of $C_2$ is connected to a virtual ground node, allowing for the following relations between $q_1$, $q_2$, $V_{out}$ and $V_{in}$:

$$q_2(n) = q_1(n) \quad (A1)$$

$$q_1(n) = C_1\left[(0-0) - \left(0 - V_{in}\left(n - \frac{1}{2}\right)\right)\right] = C_1 V_{in}\left(n - \frac{1}{2}\right) \quad (A2)$$

$$q_2(n) = C_1\left[(V_{out}(n) - 0) - \left(V_{out}\left(n - \frac{1}{2}\right) - 0\right)\right] = C_1\left[V_{out}(n) - V_{out}\left(n - \frac{1}{2}\right)\right] \quad (A3)$$

In addition, during phase $S_1$ no charge flows through $C_2$, therefore:

$$0 = q_2\left(n - \frac{1}{2}\right) = C_1\left[\left(V_{out}\left(n - \frac{1}{2}\right) - 0\right) - (V_{out}(n-1) - 0)\right] \quad (A4)$$

Solving, yields:

$$V_{out}\left(n - \frac{1}{2}\right) = V_{out}(n - 1) \quad (A5)$$

This can be replaced in (A3), and equated with (A2), to relate $V_{out}$ and $V_{in}$, obtaining:

$$V_{out}(n) - V_{out}(n - 1) = \left(\frac{C_1}{C_2}\right)V_{in}\left(n - \frac{1}{2}\right) \quad (A6)$$

Which corresponds to the delayed integrator or discrete time accumulator. Conversely, due to (A5), $$V_{out}(n) - V_{out}\left(n - \frac{1}{2}\right) = \left(\frac{C_1}{C_2}\right)V_{in}\left(n - \frac{1}{2}\right) \quad (A7)$$

Finding the charge flow through capacitor $C_L$:

$$q_L(n) = \quad (A8)$$
$$C_L\left[(V_{out}(n) - 0) - \left(V_{out}\left(n - \frac{1}{2}\right) - 0\right)\right] = C_L\left[V_{out}(n) - V_{out}\left(n - \frac{1}{2}\right)\right]$$

Replacing the second factor on the right-hand side for (A7) yields the charge in terms of the input:

$$q_L(n) = C_L\left(\frac{C_1}{C_2}\right)V_{in}\left(n - \frac{1}{2}\right) \quad (A9)$$

Similarly, the charge flow through $C_3$, can be expressed as:

$$q_3(n) = C_3\left[(V_{out}(n) - V_{in}(n)) - \left(V_{out}\left(n - \frac{1}{2}\right) - 0\right)\right] = \quad (A10)$$
$$C_3\left(V_{out}(n) - V_{out}\left(n - \frac{1}{2}\right)\right) - C_3 V_{in}(n)$$

Which, again, can be expressed in terms of the input using (A7):

$$q_3(n) = C_3\left[\left(\frac{C_1}{C_2}\right)V_{in}\left(n - \frac{1}{2}\right) - V_{in}(n)\right] \quad (A11)$$

The charge provided by the OTA has to match those of $q_L$, $q_3$ and $q_2$, so $$q_{OTA}(n) = q_L(n) + q_3(n) + q_2(n) \quad (A12)$$

Replacing (A9), (A10) and (A3), and rearranging $$q_{OTA}(n) = \left[C_1 + (C_3 + C_L)\left(\frac{C_1}{C_2}\right)\right]V_{in}\left(n - \frac{1}{2}\right) - C_3 V_{in}(n) \quad (A13)$$

Assuming that $V_{in}(n-\frac{1}{2}) \approx V_{in}(n)$ $$q_{OTA}(n) = \left\{\left[C_1 + (C_3 + C_L)\left(\frac{C_1}{C_2}\right)\right] - C_3\right\}V_{in}(n) \quad (A14)$$

Applying the z-transform to both sides yields:

$$Q_{OTA}(z) = \left\{\left[C_1 + (C_3 + C_L)\left(\frac{C_1}{C_2}\right)\right] - C_3\right\}V_{in}(z) \quad (A15)$$

Solving for the $C_3$ that makes $Q_{OTA}(Z)=0$ results in $$C_3 = C_1 \frac{1 + \left(\frac{C_L}{C_2}\right)}{1 - \left(\frac{C_1}{C_2}\right)} \quad (A16)$$

Since this $C_3$ was obtained after an approximation, the actual value of $Q_{OTA}$ is not exactly zero, therefore (A13) is recalculated, considering the $C_3$ found in (A16), which results in $$q_{OTA}(n) = -C_3\left[V_{in}(n) - V_{in}\left(n - \frac{1}{2}\right)\right] \quad (A17)$$

And in the z-domain $$Q_{OTA}(z) = -V_{in}(z) \cdot C_3 (1 - z^{-\frac{1}{2}}) \quad (A18)$$

Evaluating $z = e^{j\omega T_s}$ to obtain the frequency response of the magnitude, $$\left|\frac{Q_{OTA}}{V_{in}}\right|(\omega) = C_3 |1 - e^{-\frac{j\omega T}{2}}| \quad (A19)$$

Considering an oversampled system with bandwidth, BW, and sampling frequency, $F_S = 1/T_S$, the oversampling ratio, OSR, can be defined as $$OSR = \frac{F_S}{2 \cdot BW}.$$

Evaluating (A19) at the bandwidth of the system yields:

$$\left|\frac{Q_{OTA,PCC}}{V_{in}}\right|(2\pi \cdot BW) = \quad (A20)$$
$$C_3|1 - e^{-j2\pi \cdot BW \cdot T_S/2}| = C_3|1 - e^{-\frac{j\pi}{2 \cdot OSR}}| \approx C_3 \frac{\pi}{2 \cdot OSR}$$

The last approximation in (A20), holds when $$OSR \gg \frac{\pi}{4} \approx 0.78$$

which is always met in oversampled systems.

For integrator 100 of FIG. 1A the charge required from the OTA is:

$$q_{OTA,conv}(n) = C_{LTOT}(V_{out}(n) - V_{out}(n-1))$$ (A21)

Which can be expressed in terms of the input as:

$$q_{OTA,conv}(n) = C_{LTOT}\frac{C_1}{C_2}V_{in}\left(n - \frac{1}{2}\right)$$ (A22)

And the frequency response can be expressed as:

$$\left|\frac{Q_{OTA,conv}}{V_{in}}\right|(\omega) = C_{LTOT}\frac{C_1}{C_2}$$ (A23)

Comparing (A20) and (A23), the charge demanded to OTA 101 in a PCC system (e.g., circuit 300) can be relaxed by increasing OSR, whereas it is independent of OSR in a conventional case.

Figure 4A:
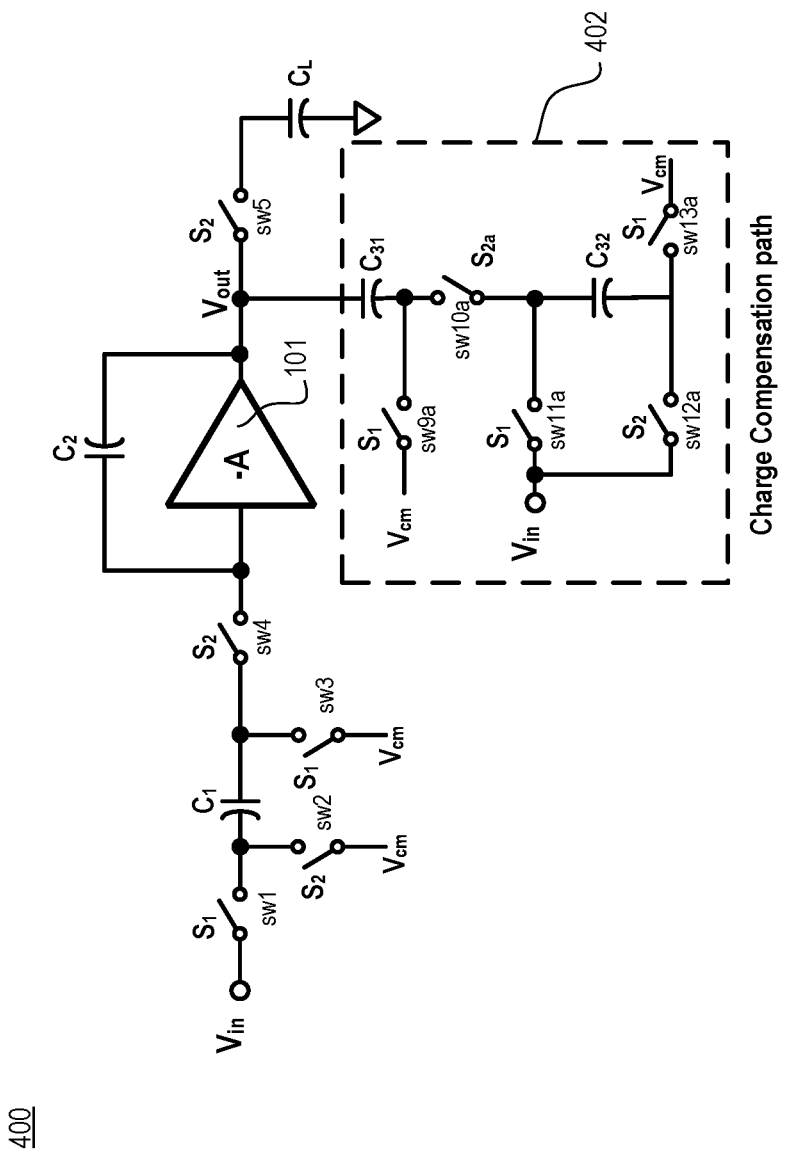
FIG. 4A illustrates a switch-capacitor based passive charge compensation circuit for slewing mitigation, in accordance with some embodiments.

FIG. 4A illustrates apparatus 400 with a switch-capacitor based passive charge compensation circuit for slewing mitigation, in accordance with some embodiments. Apparatus 400 includes integrator 100 and charge compensation path or circuit 402. In some embodiments, charge compensation path or circuit 402 includes switches sw9a, sw11a, and sw13a that are part of the first set of switches controllable by clock phase $S_1$. In some embodiments, charge compensation path or circuit 402 includes switch sw12a that is part of the second set of switches controllable by clock phase $S_2$. In some embodiments, charge compensation path or circuit 402 includes switch sw10a which is controllable by phase Sea. Switches sw9a and sw13a are coupled to the node that provides common mode voltage $V_{cm}$. In some embodiments, charge compensation path or circuit 402 includes capacitors $C_{31}$ and $C_{32}$, where capacitor $C_{31}$ is coupled to switches sw9a, sw10a, and output node $V_{out}$ as shown and where capacitor $C_{32}$ is coupled to switches sw11a, sw12a, and sw13a as shown. In various embodiments, switches sw11a and sw12a receive input $V_{in}$.

With reference to equation 13 and FIG. 3, the denominator of equation (13) shows a dependence with the integrator gain $C_1/C_2$. To get a realizable value for $C_3$, the gain has to be smaller than 1, in accordance with some embodiments. However, some applications require a gain larger or equal to 1. In some embodiments, one alternative to achieve this is to replace the compensation circuitry with a set of n equal-valued capacitors which are charged in parallel during phase $S_1$ and connected in series during phase $S_2$. Now, the gain restriction is relaxed to $n > C_1/C_2$, at the cost of additional switches and capacitors. In FIG. 4A an implementation for a stage gain below 2 (n=2) is shown. The values of the compensation capacitor are:

$$C_{31} = C_{32} = 2C_1 \cdot \frac{C_2 + C_L}{2C_2 - C_1}$$ (15)

Figure 4B:
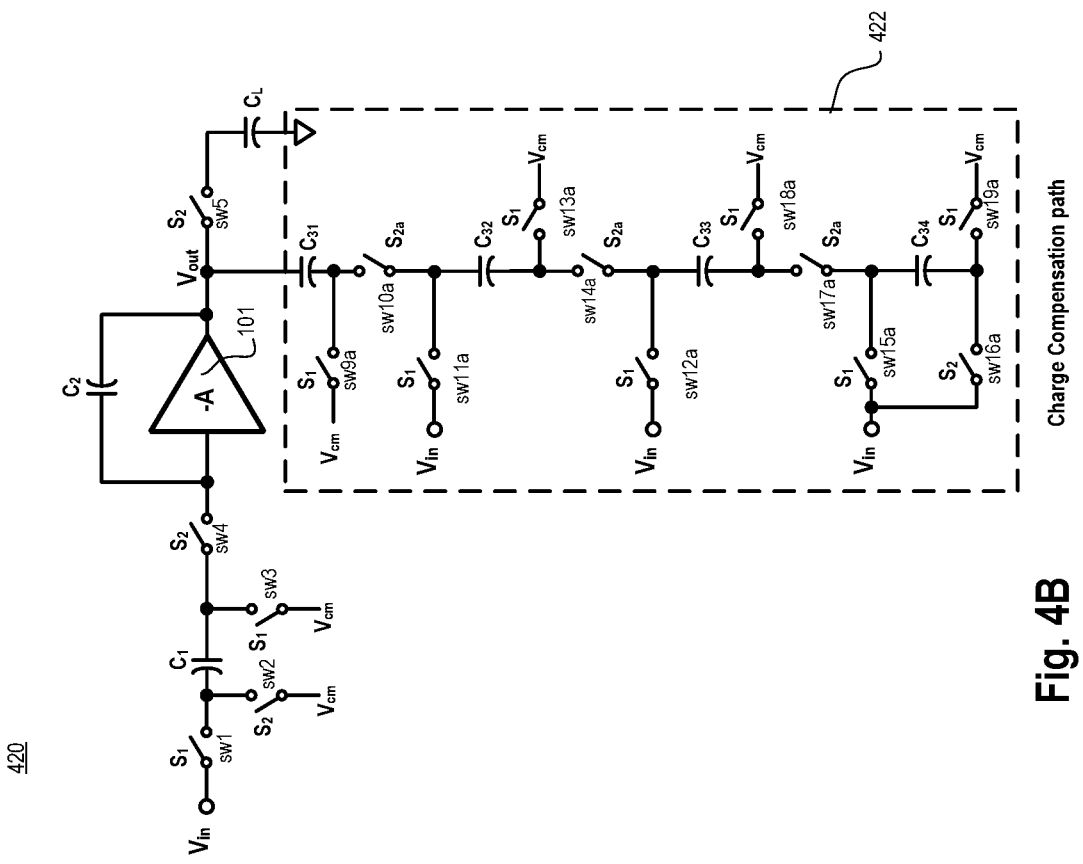
FIG. 4B illustrates a switch-capacitor based passive charge compensation circuit for slewing mitigation in the applications where gain (C1/C2) is less than 4, in accordance with some embodiments.

FIG. 4B illustrates apparatus 420 having a switch-capacitor based passive charge compensation circuit for slewing mitigation in the applications where gain ($C_1/C_2$) is less than 4, in accordance with some embodiments. Apparatus 400 comprises integrator 100 and charge compensation path or circuit 422. Compared to charge compensation path 402, charge compensation path 422 includes switches sw15a, sw18a, and sw19a of the first set of switches that are controllable by $S_1$. Charge compensation path 422 further includes switch sw16a which is controllable by $S_2$, and switch sw17a controllable by 52a. Like switch sw13a, switches sw18a and sw19a are coupled to node that provides common mode voltage $V_{cm}$. Switches sw15a and sw16a are coupled to input $V_{in}$. Compared to apparatus 400, here, two more capacitors $C_{33}$ and $C_{34}$ are added in charge compensation path 422, and capacitance of capacitor $C_1$ is substantially four times the capacitance of capacitor $C_2$. As such, higher gain ($V_{out}/V_{in}$) is achieved compared to apparatus 400 FIG. 4A.

Figure 5:
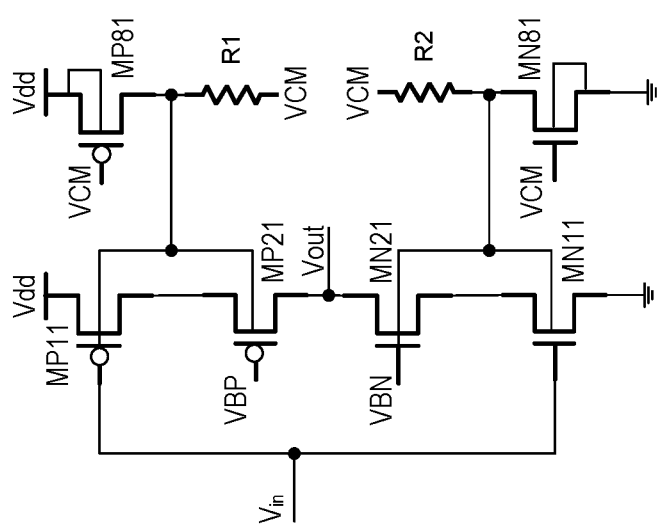
FIG. 5 illustrates a schematic of an inverter-based OTA, in accordance with some embodiments.

FIG. 5 illustrates schematic 500 of an inverter-based OTA (e.g., 101), in accordance with some embodiments. Schematic 500 comprises p-type transistors MP11, MP21, MP81, n-type transistors MN11, MN21, and MN81, and resistive devices R1 and R2 coupled as shown. Transistor MP21 is controllable by bias voltage VBP. Transistor MN21 is controllable by bias voltage VBN. Any suitable bias generator can be used to generate the bias voltage VBP or VBN. For example, a bandgap reference generator, a resistor divider, etc. can be used to generate VBP or VBN. In some embodiments, body or substrate terminals of MP11 and MN21 are biased by a version of $V_{cm}$. For example, p-type transistor MP81 which is biased by $V_{cm}$ and coupled to resistor R1, which in turn receives $V_{cm}$ together form a bias circuit to bias the body or substrate of transistors MP11 and MP21 as shown. In the same manner, the body or substrate of MN11 and MN21 is biased by version of $V_{cm}$. For example, n-type transistor MN81 which is biased by $V_{cm}$ and coupled to resistor R1, which in turn receives $V_{cm}$ together form a bias circuit to bias the body or substrate of transistors MN11 and MN21 as shown.

A set of simulations are run using the transistor level OTA of FIG. 5. The integrators are implemented in a single ended structure using $C_1$=2 pF, $C_2$=4 pF and $C_L$=0.5 pF. For the PCC integrator, using eq. (7), $C_3$ are calculated to be 4.5 pF. Also, to avoid degrading the loop bandwidth, as discussed in the previous section, capacitor $C_3$ is disconnected from OTA 500 after 3 ns from the beginning of $S_2$.

Figures 6A, 6B:
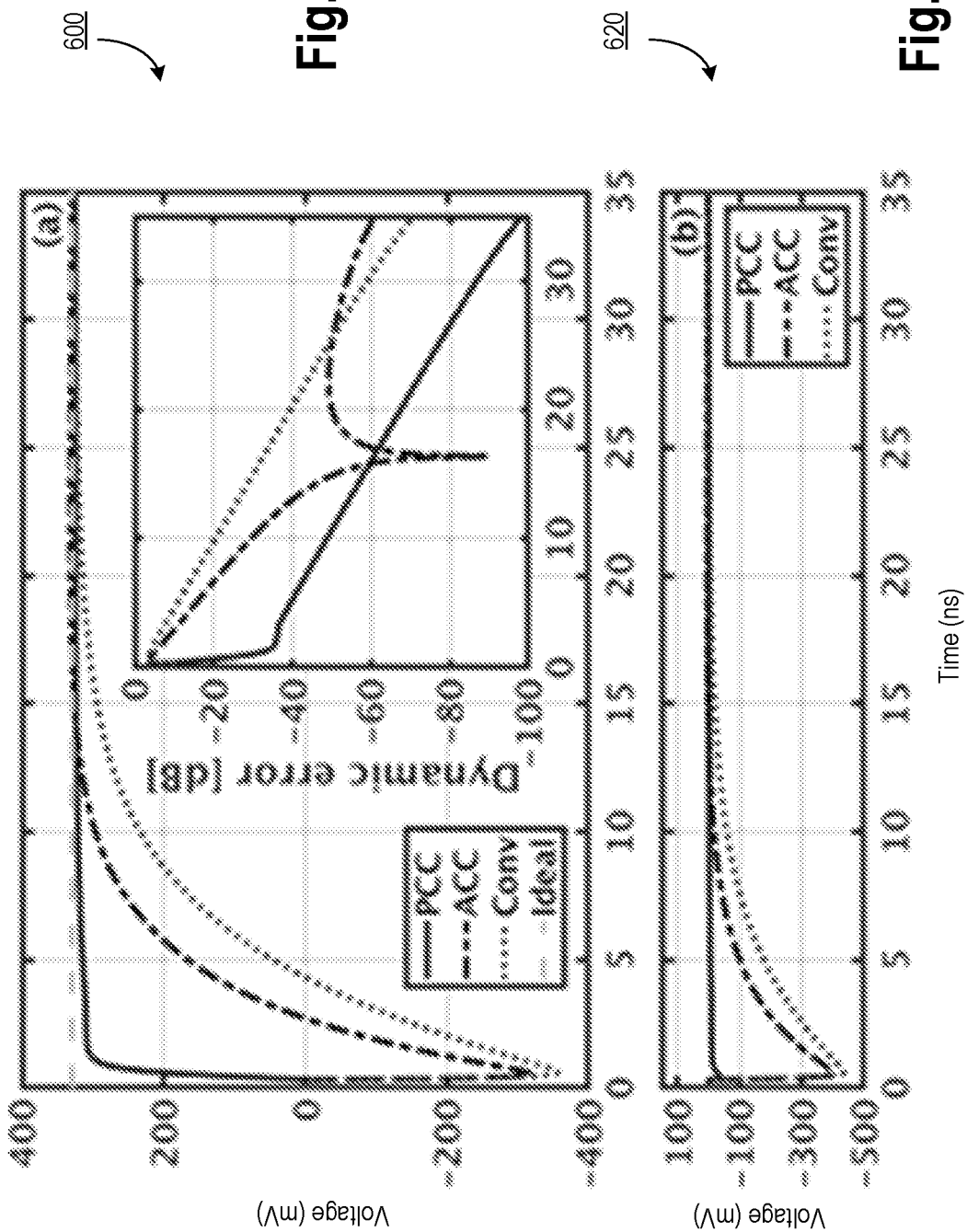
FIGS. 6A-B illustrate plots showing integrator output voltage over time, and voltage at the virtual ground node over time, respectively, in accordance with some embodiments.

FIGS. 6A-B illustrate plots 600 and 620 showing integrator output voltage $V_{out}$ over time (and an inset shows dynamic error in dB), and voltage at the virtual ground node over time, respectively, in accordance with some embodiments. The step response of the system is simulated, using a positive input step of height $V_{DD}/2$. FIG. 6A shows the integrator output voltage transient during the charge transfer phase $S_2$. The DC voltage of OTA 101 (also equal to $V_{DD}/2$) has been removed for clarity. Also, the voltage at the virtual ground node is plotted in FIG. 6B.

Initially both ACC and integrator 100 have a feedforward transient through capacitor $C_2$. In the PCC integrator (e.g., circuits 300, 400, or 420), the compensation path 301 counteracts this effect, starting from a more favorable initial condition. Moreover, after 3.5 ns, once the compensation path is disconnected, the dynamic error for PCC evolves with a slope like that of integrator 100, but with an over 20 dB advantage. Note, that the ACC, even though faster than integrator 100, seems to overshoot around 17 ns, producing the notch seen in the logarithmic plot shown in the inset of FIG. 6A. Then it quickly degrades to an error level comparable to integrator 100. Finally, all three integrators settle to the same overall error determined by the static error, set by DC gain of OTA 101, which is 70 dB (yielding a static error of −70 dB).

From the virtual ground voltage plot 620 (FIG. 6B), the disturbance on the PCC integrator (e.g., circuits 300, 400, or 420) is greatly reduced, experiencing a peak of about −36 mV, compared to −404 mV in the ACC and −434 mV in integrator 100. This makes the PCC integrator (e.g., circuits 300, 400, or 420) a better approximation to an ideal integrator.

Figure 7:
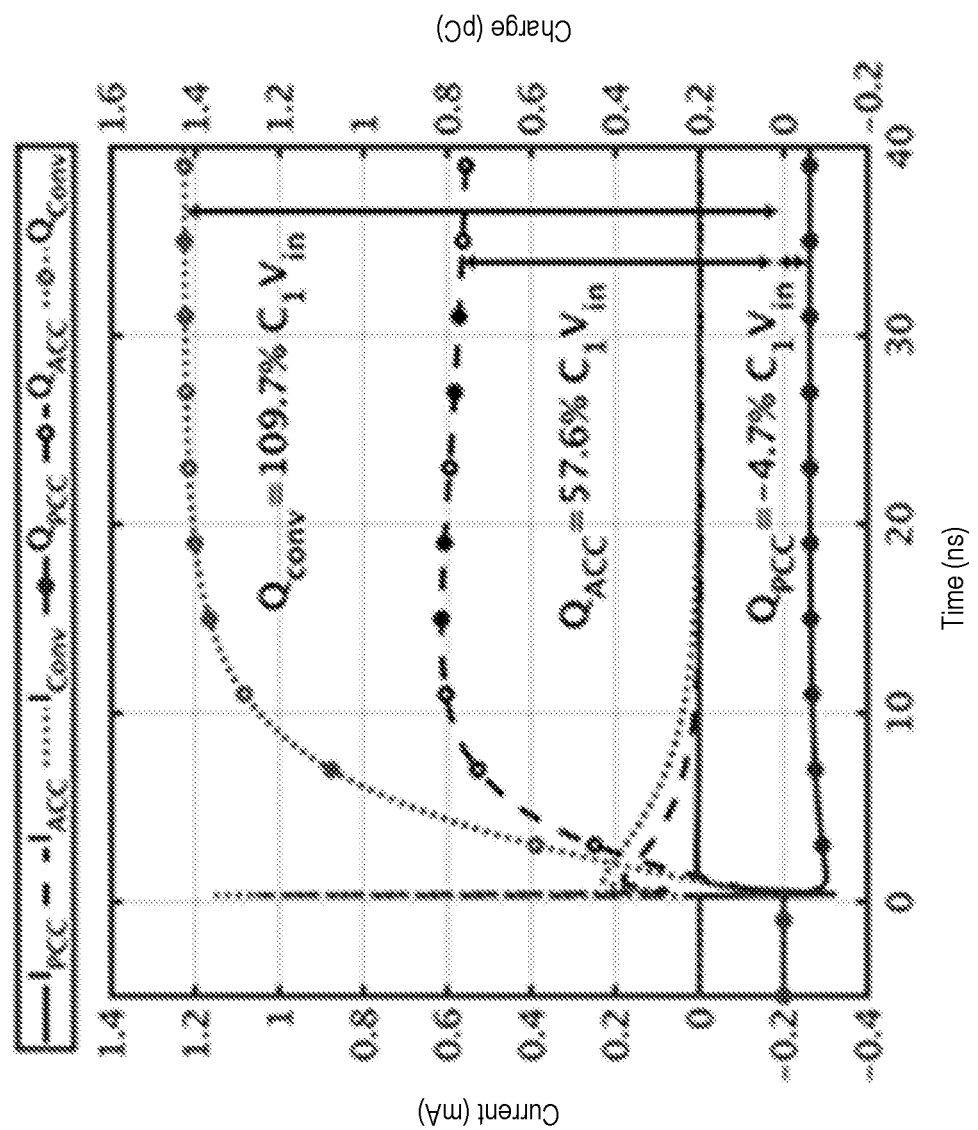
FIG. 7 illustrates a plot showing current and charge sourced/sunk by OTA in various schemes.

FIG. 7 illustrates plot 700 showing current and charge sourced/sunk by OTA 101 in various schemes. In FIG. 7, the OTA's output current is shown, where the convention used represents current and charge through the OTA as positive (negative) if sourced (sank) by it. With a conventional inverting integrator, for a positive input step, it would be expected that the output current is sourced by the OTA. This is confirmed by simulations, both for conventional and ACC, as shown in FIG. 7. The total charge provided by the OTA in a conventional integrator is 110% of $C_1V_{in}$, while that for ACC it is only 58%, showing some improvement. However, the PCC OTA merely needs to provide 5% of $C_1V_{in}$, as shown in FIG. 7. This shows the significant improvement achieved by the proposed charge compensation scheme of various embodiments. Ideally, the total charge provided by PCC OTA should be zero, but practical non-idealities prevent this. This is partly due to mismatch in switch resistances at the initial transient. However, the total charge within such transient is very small, in this example.

Figure 8:
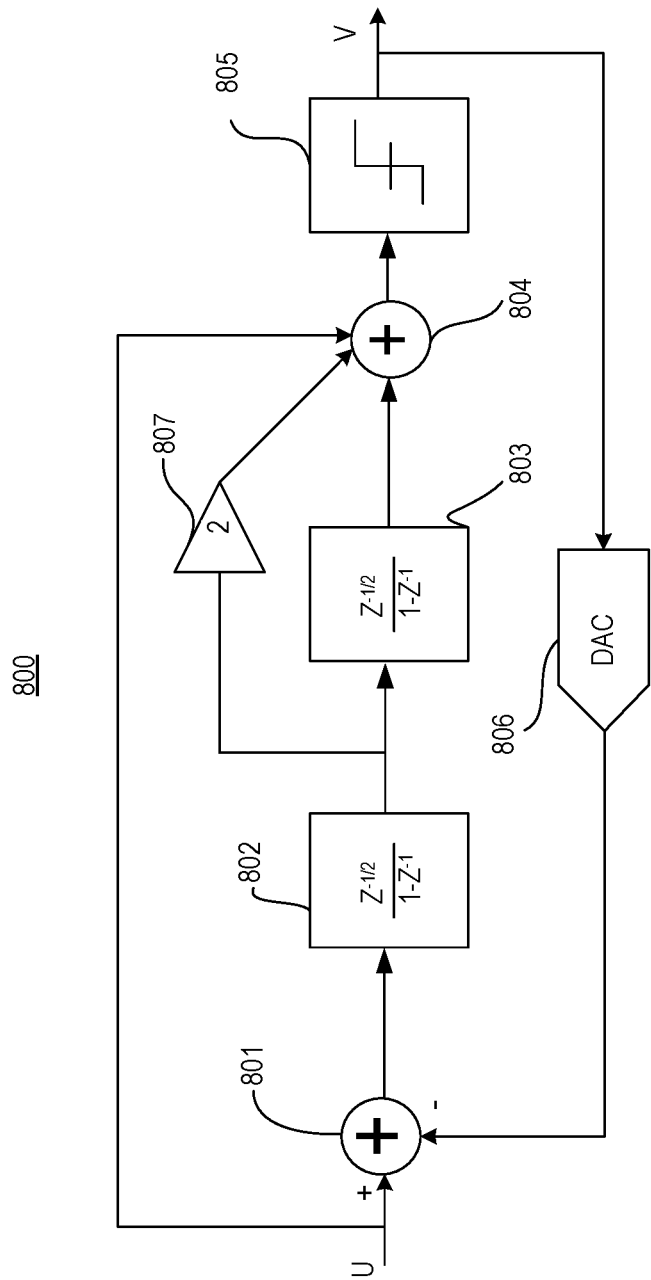
FIG. 8 illustrates a low distortion second-order delta-sigma modulator (DSM) using the switch-capacitor based passive charge compensation circuit, in accordance with some embodiments.

FIG. 8 illustrates model 800 showing low distortion second-order delta-sigma modulator (DSM) using the switch-capacitor based passive charge compensation circuit, in accordance with some embodiments. Model 800 includes adder or subtractor 801 that subtracts input U from the output of DAC 806. Model 800 includes first integrator 802, second integrator 803, adder 804, quantizer 805 (e.g., a multi-bit quantizer), DAC 806, and amplifier 807 coupled as shown. A delta-sigma modulator with a multi-bit quantizer has reduced quantization noise compared to one with a single-bit quantizer for the same loop order and oversampling ratio. Hence, the swing at the output of the feedback DAC is smaller, which relaxes the linearity requirements of the loop filter. This benefit is gained at the cost of increased power consumption in multi-bit quantizer 805 and the mismatch errors in feedback DAC 806, which can significantly degrade the linearity. The DAC mismatch error can be shaped using dynamic element matching or corrected using digital calibration. Both techniques use additional power and area. In the case of a single-bit delta-sigma ADC, the feedback DAC is inherently linear. Hence, no extra calibration is required, and merely one comparator is used for the quantizer implementation.

ADCs are apparatuses that convert continuous physical quantities (e.g., voltages) to digital numbers that represent the amplitude of the physical quantities. In some embodiments, the ADC converts an analog input to its corresponding digital representation. Any suitable ADC may be used to implement ADC. For example, the ADC is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called sub-ranging quantizer), sigma-delta ADC (also known as a delta-sigma ADC), time-interleaved ADC, ADC with intermediate FM stage, or time-stretch ADC. For purposes of explaining the various embodiments, the ADC is flash ADC.

A DAC is an apparatus that converts digital data (e.g., binary or thermometer coded) into an analog signal (current, voltage, or electric charge). In some embodiments, the DACs is a pulse width modulator DAC. In other embodiments, other types of DACs may be used for implementing the DACs. For example, interpolating DAC (also known as oversampling DAC), binary weighted DACs (e.g., switched resistor DAC, switched capacitor DAC, switched current-source DAC), R-2R ladder DAC, thermometer coded DAC, segmented DAC, etc. may be used for implementing the DACs.

Single bit delta sigma modulators are attractive as one-bit DAC. A single-bit DAC is inherently linear and less complex in implementation. But in such design the feedback DAC has a larger output swing between $\pm V_{ref}$, and the first integrator must provide a large slewing current or avoid slewing altogether. Hence the design of first integrator in the loop filter becomes challenging, and it usually consumes a significant part of the total power budget. The charge compensation technique of various embodiments can be applied to the first integrator in discrete-time DSM and relax the OTA design requirement and hence save significant power without compromising performance, in accordance with various embodiments.

A single-bit second order DSM low distortion structure is chosen as a test case for circuit implementation as shown in FIG. 8. An OSR of 256 gives an ideal SQNR of 102 dB which is reasonable for a target specification of more than 15-bit resolution.

Figure 9:
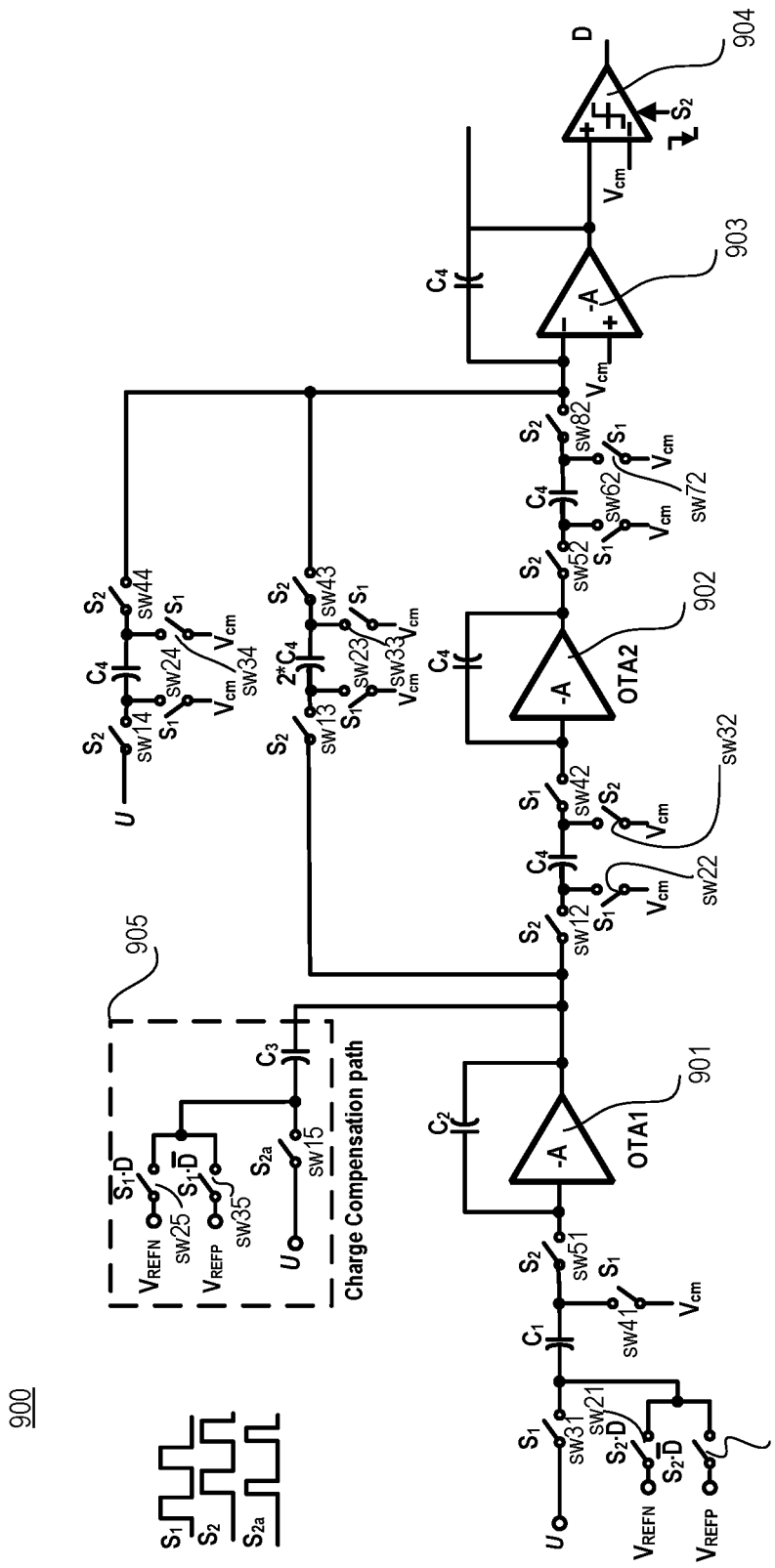
FIG. 9 illustrates a schematic of a low distortion second-order delta-sigma modulator (DSM) using the switch-capacitor based passive charge compensation circuit, in accordance with some embodiments.

FIG. 9 illustrates a schematic of a low distortion second-order delta-sigma modulator (DSM) 900 using the switch-capacitor based passive charge compensation circuit, in accordance with some embodiments. The switched-capacitor implementation of the single-bit second-order DSM is shown in FIG. 9. A person killed in the art can modify DSM 900 and make it a differential or pseudo-differential DSM. Here, single-ended version is shown for simplicity and the explanation applies to embodiments of differential or pseudo-differential DSM.

DSM 900 illustrates an implementation of model 800, in accordance with some embodiments. DSM 900 comprises a first integrator (e.g., 802) having OTA 901, a second integrator (e.g., 803) having OTA 902, amplifier 903, quantizer 904, and charge compensation path 905 coupled as shown. In some embodiments, the first integrator comprises OTA 101, switches sw11, sw21, sw31, sw41, and sw51, and capacitors $C_1$ and $C_2$ coupled as shown. The input U (same as $V_{in}$) is received by the first integrator. The output of the first integrator is coupled to a charge compensation path or circuit 905 which can be like any one of charge compensation circuits of FIG. 3, FIG. 4A, and FIG. 4B. The first integrator is like integrator 100. Here, switches sw31 and sw41 are controlled by $S_1$, switch sw51 is controlled by $S_2$, and switches sw11 and sw21 are controlled by $S_2.D$ and $S_2.\overline{D}$, respectively, where 'D' is the output of quantizer 904. In some embodiments, switches sw11 and sw21 receive analog voltages $V_{REFP}$ and $V_{REFN}$, respectively. In one example, $V_{REFP}$ is 1.2 V (e.g., $V_{dd}$ supply voltage), $V_{REFN}$ is 0 V (e.g., ground voltage), and $V_{cm}$ is 0.6 V (e.g., ½ of $V_{dd}$). In some embodiments, sw11 and sw21 together perform the function of switch sw2 of integrator 100. In FIG. 1, switch sw2 is coupled to the node providing $V_{cm}$ while in FIG. 9, switches sw11 and sw21 subtract the output of DAC 806.

In some embodiments, the second integrator comprises OTA2 902 switches sw12, sw22, sw32, and sw42, a feedback capacitor having capacitance $C_4$, and a capacitor between switches sw12 and sw42 having capacitance $C_4$. Switches sw12 and sw32 are controllable by $S_2$, while switches sw22 and sw42 are controllable by $S_1$. In various embodiments, switches sw22 and sw42 are coupled to the node that provides the common mode voltage $V_{cm}$.

In some embodiments, DSM 900 includes an adder (e.g., adder 804) comprising switches sw52, sw62, sw72, and sw82, capacitor between sw52 and sw82 with capacitance $C_4$, amplifier 903, and feedback capacitor coupling the output of amplifier 902 with input of amplifier 903, wherein the feedback capacitor has capacitance $C_4$. In some embodiments, amplifier 903 is a differential amplifier with a second input coupled to the node providing $V_{cm}$. In some embodiments, there is an additional switch (not shown) in parallel to the capacitor having capacitance $C_4$ which is coupled to the input and output of amplifier 903. This additional switch is controllable by $S_1$ phase, in accordance with some embodiments. The output of amplifier 903 is coupled to quantizer 904 which generates the digital output D which controls switches sw21, sw11, sw25, and sw35, where switches sw25 and sw35 are part of charge compensation path 905.

In some embodiments, charge compensation path or circuit 905 comprises switches sw15, sw25, and sw35, and capacitor $C_3$. Switch sw15 receives input U. In some embodiments, switch sw25 receives $V_{REFN}$ and is controllable by S1.D. In some embodiments, switch sw35 receives $V_{REFP}$ and is controllable by S1.$\overline{D}$. In various embodiments, capacitor C3 is coupled to the output of OTA1 901.

In some embodiments, the input of amplifier 903 is coupled to the output of OTA1 901 via a switch-capacitor feedback network. The switch-capacitor feedback network comprises switches sw13, sw23, sw33, and sw43, and a capacitor of capacitance $2C_4$ between switches sw13 and sw43, where switches sw23 and sw33 are coupled to the node that provides common mode voltage $V_{cm}$. In various embodiments, switches sw13 and sw43 are controllable by $S_2$. In various embodiments, switches sw23 and sw33 are controllable by $S_1$. In some embodiments, the input U is coupled to the input of amplifier 903 via another switch-capacitor network. In some embodiments, the other switch-capacitor network switches sw14, sw24, sw34, sw44, capacitor with capacitance $C_4$ between switches sw14 and sw44, where switches sw24 and sw34 are coupled to the node that provides common mode voltage $V_{cm}$. In various embodiments, switches sw14 and sw44 are controllable by $S_2$. In various embodiments, switches sw24 and sw34 are controllable by $S_1$.

The switched-capacitor common mode feedback is used to correct the output common mode drift. An active adder is used to implement the analog summation at the input of the quantizer. The input sampling capacitor is shared with the feedback DAC and the input network is replicated in the charge compensation path.

Inverter based OTAs are highly power-efficient and achieve good performance in delta-sigma ADCs. There are several attributes which makes them more efficient than conventional telescopic and folded cascode OTAs. Since the input is applied to both PMOS and NMOS devices, the transconductance is doubled for the same bias current, hence achieving better slew-rate, gain bandwidth and noise performance. Some drawbacks of inverter-based OTAs are low gain and sensitivity to process, voltage and temperature (PVT) variations.

Several techniques improve the robustness to PVT variations. For example, a dedicated low dropout (LDO) is used in some techniques to adjust inverter supply voltage, and a replica inverter is used in the feedback path to sense PVT variations and adjust the LDO voltage. However, an extra block is required along with the LDO to generate the input common mode voltage, which consumes extra power and area. Switching cascode transistors in a dynamic biasing technique limits the operating bandwidth of the inverter. In an on-chip body biasing technique, a separate circuit with a transistor and a resistor is used to track PVT variations, and to adjust the bulk voltage of the transistors in the inverter. The proposed passive charge compensation technique relaxes the OTAs requirements by significant amount, as most of the charge is provided by the charge compensation circuit during slewing. Hence, even at the slow corner when the OTA current is significantly low, the error charge can be compensated by charge compensation circuit.

In various embodiments, the first integrator is implemented with the inverter OTA1 901 shown in FIG. 5. In some embodiments, OTA2 902 in the second integrator is a scaled version of OTA1 901. An on-chip body bias is used to reduce the sensitivity to PVT variation. The simulated performances of OTA1 901 and OTA2 902 are given in Table I.

TABLE 1

| Specification | OTA1 | OTA2 |
| --- | --- | --- |
| Supply Voltage | 1.3 | 1.3 |
| DC-gain(dB) | 70.4 | 70 |
| GBW(MHz) | 38 | 26 |
| Phase Margin (degree) | 74 | 80 |
| Static Power Consumption (µW) | 23.4 | 17 |

In some embodiments, the input switch in the charge compensation path 905 is implemented with a transmission gate. Since the linearity of the switch is not critical, bootstrapping may not be used, in accordance with some embodiments. In some examples, the charge injection is not an issue here, since the switch is turned on only for one half of the clock phase $S_2$. Positive and negative reference switches are implemented with PMOS and NMOS transistors, respectively. The comparator is implemented with a strong-arm latch.

In one example, the second-order DSM with charge compensation technique of some embodiments is designed in 65 nm CMOS technology. The performance of DSM with the charge compensated integrator of FIG. 3 are compared to the same DSM with conventional integrator. The circuit implementation of the second-order DSM is shown in FIG. 9. To further verify the practicality of the proposed technique, the front-end of the DSM is laid out and post layout extracted simulation is performed.

Figure 10:
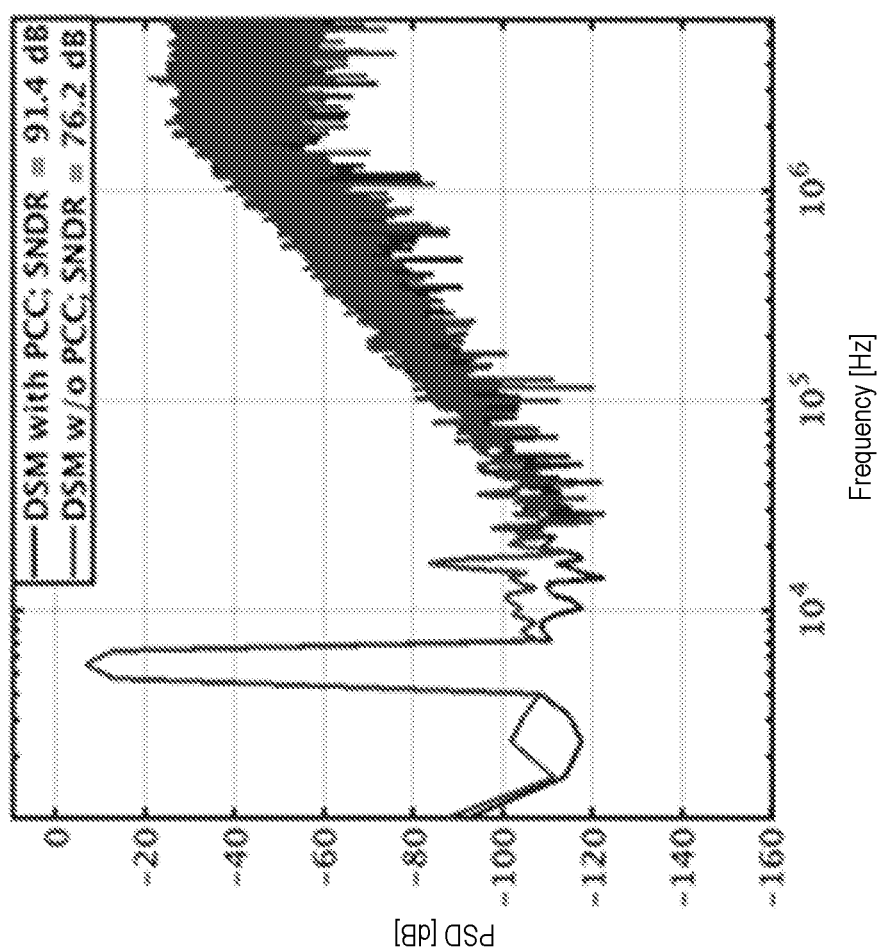
FIG. 10 illustrates a plot showing power spectral density (PSD) of the extracted second-order DSM with and without the switch-capacitor based passive charge compensation circuit, in accordance with some embodiments.

FIG. 10 illustrates plot 1000 showing power spectral density (PSD) of the extracted second-order DSM with and without the switch-capacitor based passive charge compensation circuit, in accordance with some embodiments. The input sampling capacitor is chosen to be $C_1=2$ pF based on thermal noise requirement, to achieve more than 15-bit resolution. Also, an integrating capacitor $C_2=4$ pF and a charge compensation capacitor $C_3=4.5$ pF is chosen. The capacitors in the subsequent stage are $C_4=0.5$ pF.

The signal bandwidth is 25 kHz, and the sampling frequency is 12.8 MHz, for an oversampling ratio of 256. The power spectral densities (PSDs) with and without charge compensation are shown in FIG. 10. The input signal amplitude is −6 dBFS and the signal frequency is 5.47 kHz. There is significant reduction (15 dB) of the third harmonic (HD3), and an overall SNDR improvement of more than 12 dB compared to the conventional implementation.

Figure 11:
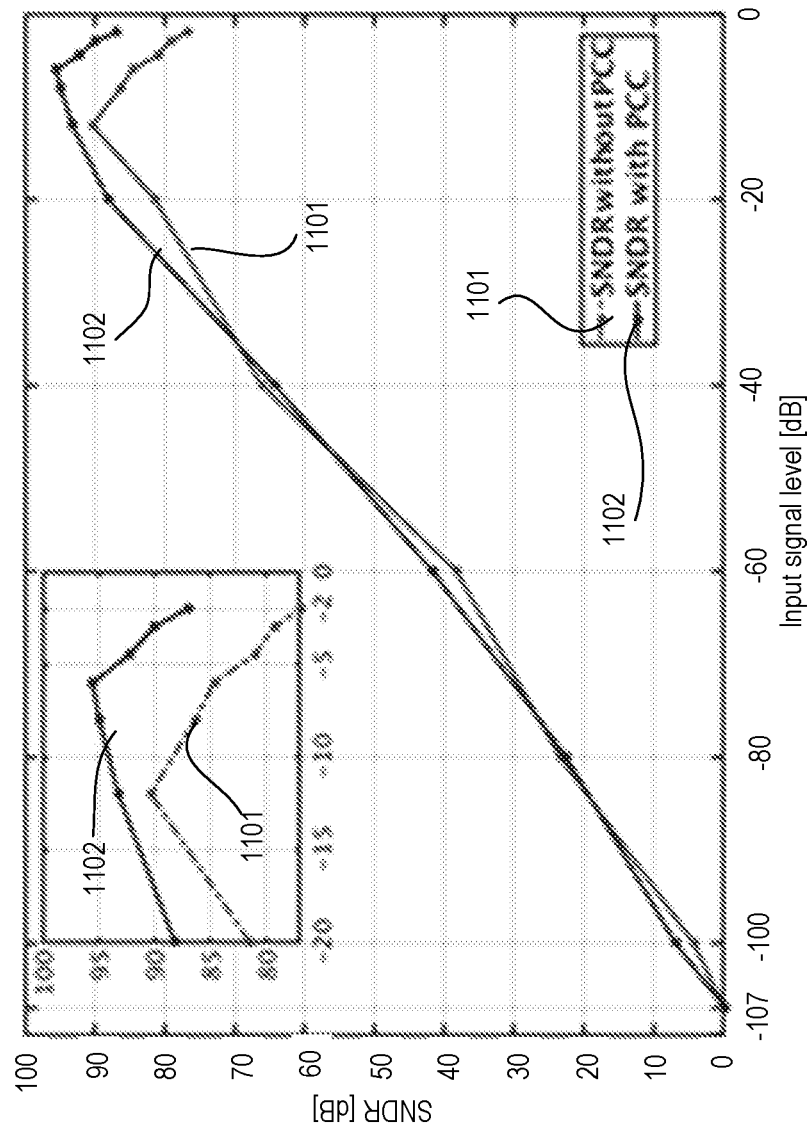
FIG. 11 illustrates a plot showing SNDR versus input amplitude with and without the switch-capacitor based passive charge compensation circuit, in accordance with some embodiments.

FIG. 11 illustrates plot 1100 showing SNDR vs. input amplitude with and without the switch-capacitor based passive charge compensation circuit, in accordance with some embodiments. Here, SNDR without PCC is shown by curve 1101, while SNDR with PCC is shown by curve 1102. The modulator with charge compensation achieves a peak SNDR of 95.6 dB, whereas that for the conventional DSM is merely 90 dB. Also, the performance of conventional DSM degrades significantly at the larger input signal level compared to charge-compensated DSM. At −6 dBFS input signal level, the SNDR of conventional DSM degrades by 12 dB compared to the charge-compensated DSM.

Figures 12A, 12B:
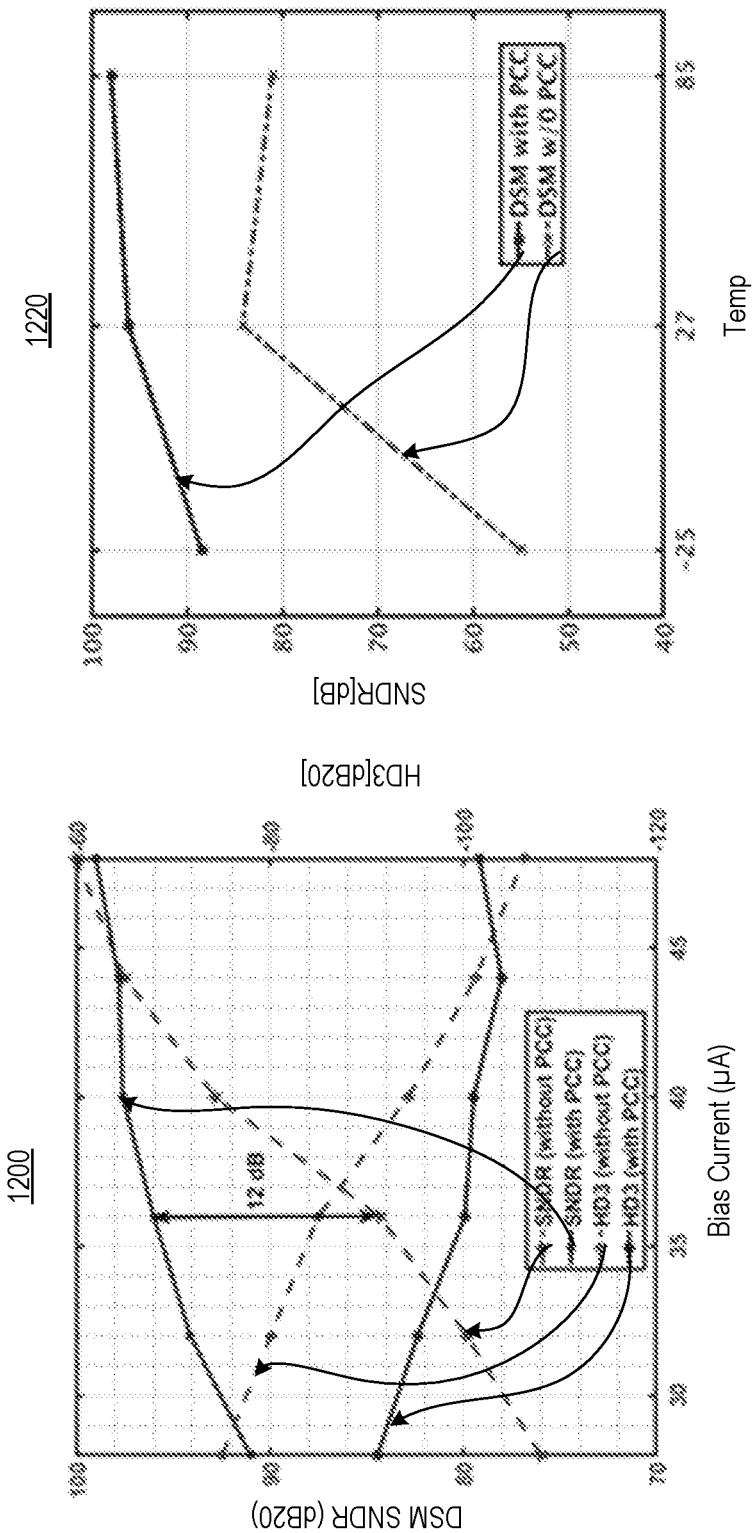
FIGS. 12A-B illustrate plots showing simulated harmonic distortion (HD3) and SNDR verses first OTA current with and without charge compensation, respectively.

FIGS. 12A-B illustrate plots 1200 and 1220 showing simulated harmonic distortion (HD3) and SNDR vs. first OTA current with and without charge compensation, respectively, in accordance with some embodiments. Plot 1200 of FIG. 12A shows the simulated HD3 and SNDR versus first OTA current with and without charge compensation. The DSM with charge compensation technique can achieve the same performance as a conventional DSM with ~30% less current. Plot 1220 of FIG. 12B shows the SNDR across different temperatures. The bulk bias of the inverter OTA is turned off for the first OTA to verify the effectiveness of the charge compensation technique across temperature. In this example, there is merely a 6 dB degradation in the overall SNDR of the second-order delta sigma ADC.

Figure 13:
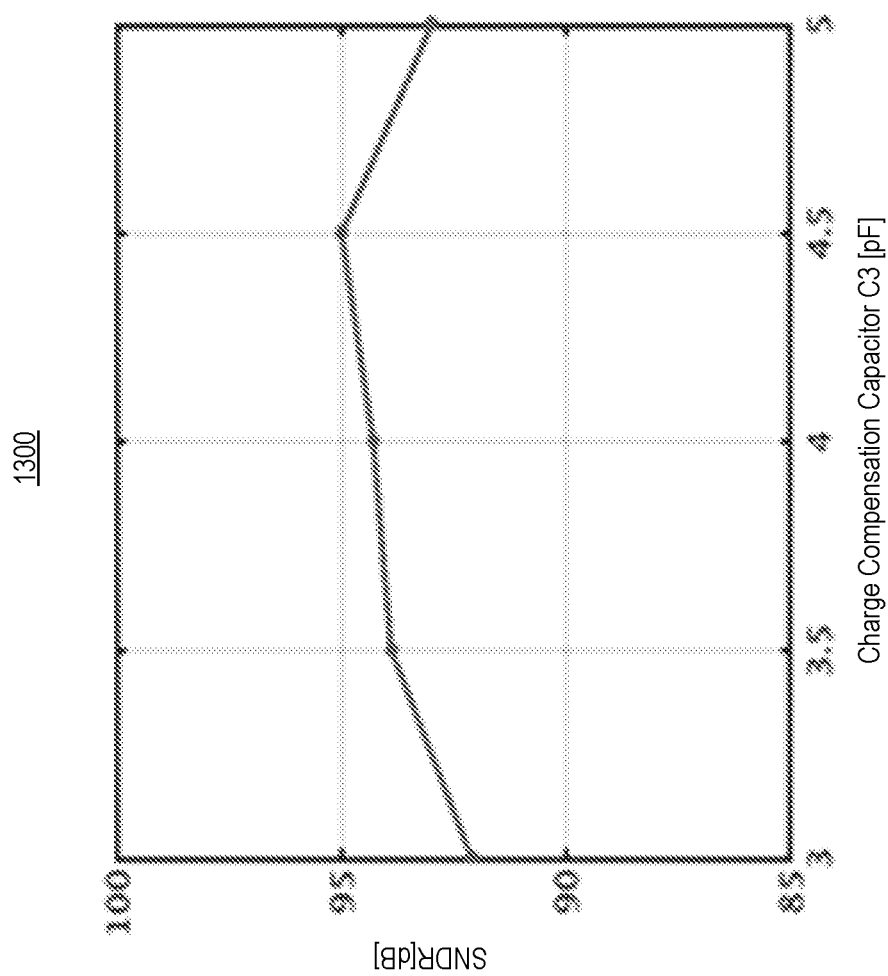
FIG. 13 illustrates a plot showing SNDR variation with value of charge compensation capacitor, in accordance with some embodiments.

FIG. 13 illustrates plot 1300 showing SNDR variation with value of charge compensation capacitor, in accordance with some embodiments. FIG. 13 illustrates the insensitivity of the proposed scheme of various embodiments to variations in the compensation capacitor $C_3$. Across a range of 2 pF change in $C_3$, the performance of the DSM degrades by less than 3 dB.

The simulated DSM with the charge compensation technique consumes 105 μW (including static power as well as dynamic power used in charging of capacitors). However, since the digital logic is not synthesized, the digital power is not included. In this example, the first integrator consumes 55 μW, while the second integrator and the comparator together consume 43 μW. Assuming that the clock generator and digital logic consume 20% of the total power, the total power consumption of the ADC is 126 μW.

Table 2 gives the performance comparison of second order DSM with and without charge compensation.

TABLE 2

|  | Conventional DSM | PCC based DSM |
|---|---|---|
| Process (nm) | 65 | 65 |
| Supply (V) | 1.2 | 1.2 |
| Bandwidth (kHz) | 25 | 25 |
| SNDR (dB) | 76.2 | 91.4 |
| Power (μW) | 119 | 126 |
| $FOM_{S, SNDR}$ (dB) | 159.5 | 174.4 |

Table 3 compares the results of this work with those of the other state-of-art results with similar signal bandwidth.

TABLE 3

|  | Prior Art 1 | Prior Art 2 | Prior Art 3 | Prior Art 4 | Embodiment |
|---|---|---|---|---|---|
| Process(nm) | 65 | 180 | 180 | 65 | 65 |
| Supply(V) | 0.8 | 1.8 | 0.9 | 1.2 | 1.2 |
| Bandwidth (kHz) | 20 | 20 | 20 | 20 | 25 |
| SNDR(dB) | 91 | 97.7 | 86.4 | 100.8 | 91.4 |
| Power (μW) | 230 | 300 | 103.4 | 550 | 126 |
| $FOM_W$ (pJ/conv) | 0.198 | 0.12 | 0.15 | 0.15 | 0.08 |
| $FOM_{S, SNDR}$ (dB) | 170.4 | 175.9 | 169.3 | 176.4 | 174.4 |

Where:

$$FOM_W = \frac{\text{Power}}{2 \times BW \times 2^{\frac{SNDR-1.76}{6.02}}}$$

$$FOM_{S,SNDR} = SNDR + 10 \times \log_{10}\left(\frac{BW}{\text{Power}}\right)$$

FIG. 14 illustrates a computer system having a switch-capacitor based passive charge compensation circuit for slewing mitigation, in accordance with some embodiments. It is pointed out that those elements of FIG. 14 having the same reference numbers (or names) as the elements of any other figure can operate or function in any manner similar to that described but are not limited to such. In some embodiments, a clock generation system 1452 that filters RF noise from a generated clock signal can be placed in any of the blocks described with reference to system 1400. Any of the blocks described herein can include the slewing mitigation technique where just the right amount of charge is provided at the switching instant to a switch capacitor circuit so that operational transconductance amplifier (OTA) does not need to provide high peak current. This may eliminate slewing altogether and allows using OTAs with less static current for the same settling accuracy.

FIG. 14 illustrates a block diagram of an embodiment of a mobile device in which flat surface interface connectors could be used. In some embodiments, computing device 1400 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 1400.

In some embodiments, computing device 1400 includes processor 1410. The various embodiments of the present disclosure may also comprise a network interface within 1470 such as a wireless interface so that a system embodiment may be incorporated into a wireless device, for example, cell phone or personal digital assistant.

In one embodiment, processor 1410 can include one or more physical devices, such as microprocessors, application processors, microcontrollers, programmable logic devices, or other processing means. The processing operations performed by processor 1410 include the execution of an operating platform or operating system on which applications and/or device functions are executed. The processing operations include operations related to I/O (input/output) with a human user or with other devices, operations related to power management, and/or operations related to connecting the computing device 1400 to another device. The processing operations may also include operations related to audio I/O and/or display I/O.

In one embodiment, computing device 1400 includes audio subsystem 1420, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1400 or connected to the computing device 1400. In one embodiment, a user interacts with the computing device 1400 by providing audio commands that are received and processed by processor 1410.

Display subsystem 1430 represents hardware (e.g., display devices) and software (e.g., drivers) components that provide a visual and/or tactile display for a user to interact with the computing device 1400. Display subsystem 1430 includes display interface 1432, which includes the particular screen or hardware device used to provide a display to a user. In one embodiment, display interface 1432 includes logic separate from processor 1410 to perform at least some processing related to the display. In one embodiment, display subsystem 1430 includes a touch screen (or touch pad) device that provides both output and input to a user.

I/O controller 1440 represents hardware devices and software components related to interaction with a user. I/O controller 1440 is operable to manage hardware that is part of audio subsystem 1420 and/or display subsystem 1430. Additionally, I/O controller 1440 illustrates a connection point for additional devices that connect to computing device 1400 through which a user might interact with the system. For example, devices that can be attached to the computing device 1400 might include microphone devices, speaker or stereo systems, video systems or other display devices, keyboard or keypad devices, or other I/O devices for use with specific applications such as card readers or other devices.

As mentioned above, I/O controller 1440 can interact with audio subsystem 1420 and/or display subsystem 1430. For example, input through a microphone or other audio device can provide input or commands for one or more applications or functions of the computing device 1400. Additionally, audio output can be provided instead of, or in addition to display output. In another example, if display subsystem 1430 includes a touch screen, the display device also acts as an input device, which can be at least partially managed by I/O controller 1440. There can also be additional buttons or switches on the computing device 1400 to provide I/O functions managed by I/O controller 1440.

In one embodiment, I/O controller 1440 manages devices such as accelerometers, cameras, light sensors or other environmental sensors, or other hardware that can be included in the computing device 1400. The input can be part of direct user interaction, as well as providing environmental input to the system to influence its operations (such as filtering for noise, adjusting displays for brightness detection, applying a flash for a camera, or other features).

In one embodiment, computing device 1400 includes power management 1450 that manages battery power usage, charging of the battery, and features related to power saving operation. Memory subsystem 1460 includes memory devices for storing information in computing device 1400. Memory can include nonvolatile (state does not change if power to the memory device is interrupted) and/or volatile (state is indeterminate if power to the memory device is interrupted) memory devices. Memory subsystem 1460 can store application data, user data, music, photos, documents, or other data, as well as system data (whether long-term or temporary) related to the execution of the applications and functions of the computing device 1400.

Elements of embodiments are also provided as a machine-readable medium (e.g., memory 1460) for storing the computer-executable instructions (e.g., instructions to implement any other processes discussed herein). The machine-readable medium (e.g., memory 1460) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1470 includes hardware devices (e.g., wireless and/or wired connectors and communication hardware) and software components (e.g., drivers, protocol stacks) to enable the computing device 1400 to communicate with external devices. The computing device 1400 could be separate devices, such as other computing devices, wireless access points or base stations, as well as peripherals such as headsets, printers, or other devices.

Connectivity 1470 can include multiple different types of connectivity. To generalize, the computing device 1400 is illustrated with cellular connectivity 1472 and wireless connectivity 1474. Cellular connectivity 1472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1474 refers to wireless connectivity that is not cellular, and can include personal area networks (such as Bluetooth, Near Field, etc.), local area networks (such as Wi-Fi), or other wireless communication.

Peripheral connections 1480 include hardware interfaces and connectors, as well as software components (e.g., drivers, protocol stacks) to make peripheral connections. It will be understood that the computing device 1400 could both be a peripheral device ("to" 1482) to other computing devices, as well as have peripheral devices ("from" 1484) connected to it. The computing device 1400 commonly has a "docking" connector to connect to other computing devices for purposes such as managing (e.g., downloading and/or uploading, changing, synchronizing) content on computing device 1400. Additionally, a docking connector can allow computing device 1400 to connect to certain peripherals that allow the computing device 1400 to control content output, for example, to audiovisual or other systems.

In addition to a proprietary docking connector or other proprietary connection hardware, the computing device 1400 can make peripheral connections 1480 via common or standards-based connectors. Common types can include a Universal Serial Bus (USB) connector (which can include any of several different hardware interfaces), DisplayPort including MiniDisplayPort (MDP), High-Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art considering the foregoing description. The embodiments of the disclosure are intended to embrace all such alternatives, modifications, and variations as to fall within the broad scope of the appended claims. Where specific details are set forth to describe example embodiments of the disclosure, it should be apparent to one skilled in the art that the disclosure can be practiced without, or with variation of, these specific details. The description is thus to be regarded as illustrative instead of limiting.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" refers to any continuous signal for which the time varying feature (variable) of the signal is a representation of some other time varying quantity, i.e., analogous to another time varying signal.

The term "digital signal" refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

The following examples pertain to further embodiments. Specifics in the examples may be used anywhere in one or more embodiments. The following examples can be combined in any manner. For example, example 7 can be combined with example 2 and/or example 9.

Example 1

An apparatus comprising: a switched capacitor integrator having an input and an output, wherein the switched capacitor integrator comprises switches and capacitors, wherein the switches include a first set of switches controllable by a first phase and a second set of switches controllable by a second phase, wherein the first phase is substantially 180 degrees out of phase relative to the second phase; and a charge compensation path coupled to the input and the output, wherein the charge compensation path comprises a first switch of the first set of switches and a second switch, wherein the second switch is controllable by a third phase, wherein the second phase overlaps the third phase.

Example 2

The apparatus of example 1, wherein the charge compensation path comprises a capacitor coupled to the output of the switched capacitor integrator.

Example 3

The apparatus of example 1, wherein the first switch is coupled to a node that provides a common mode voltage.

Example 4

The apparatus of example 3, wherein the common mode voltage is half a supply voltage.

Example 5

The apparatus of example 1, wherein the switched capacitor integrator includes: a third switch of the first set of switches, wherein the third switch is coupled to the input; a fourth switch of the second set of switches, wherein the fourth switch is coupled to the third switch, wherein the third switch is coupled to a node that provides a common mode voltage; and a first capacitor coupled to the third switch and the fourth switch.

Example 6

The apparatus of example 5, wherein the switched capacitor integrator includes: a fifth switch of the first set of switches, wherein the fifth switch is coupled to the first capacitor, wherein the fifth switch is coupled to the node that provides the common mode voltage; and a sixth switch of the second set of switches, wherein the sixth switch is coupled to the fifth switch and the first capacitor.

Example 7

The apparatus of example 6 comprises an amplifier having an input coupled to the sixth switch, and an output coupled to the output of the switched capacitor integrator.

Example 8

The apparatus of example 7 comprises a second capacitor coupled to the input of the amplifier and the output of the amplifier.

Example 9

The apparatus of example 8 comprises a seventh switch of the second set of switches, wherein the seventh switch is coupled to the output of the amplifier, the charge compensation path, and a load capacitor.

Example 10

An apparatus comprising: a switched capacitor integrator having an input and an output, wherein the switched capacitor integrator comprises switches and capacitors, and an operational transconductance amplifier, wherein the operational transconductance amplifier is coupled to the output; and a charge compensation circuit coupled to the input and the output, wherein the charge compensation circuit provides additional charge at the output, wherein the additional charge is proportional to an input voltage on the input, wherein the additional charge is provided via a capacitor.

Example 11

The apparatus of example 10, wherein the switches include a first set of switches controllable by a first phase and a second set of switches controllable by a second phase, wherein the first phase is substantially 180 degrees out of phase relative to the second phase.

Example 12

The apparatus of example 11, wherein the charge compensation circuit comprises a first switch of the first set of switches and a second switch, wherein the second switch is controllable by a third phase, wherein the second phase overlaps the third phase.

Example 13

The apparatus of example 12, wherein the first switch is coupled to a node that provides a common mode voltage.

Example 14

The apparatus of example 13, wherein the common mode voltage is half a supply voltage.

Example 15

A system comprising: a memory to store instructions; a processor circuitry to execute the instructions; and a communication interface to allow the processor circuitry to communicate with another device, wherein the processor circuitry includes a second-order delta-sigma modulator, which comprises: a switched capacitor integrator having an input and an output, wherein the switched capacitor integrator comprises switches and capacitors, and an operational transconductance amplifier, wherein the operational transconductance amplifier is coupled to the output; and a charge compensation circuit coupled to the input and the output, wherein the charge compensation circuit provides additional charge at the output, wherein the additional charge is proportional to an input voltage on the input, wherein the additional charge is provided via a capacitor.

Example 16

The system of example 15, wherein the switches include a first set of switches controllable by a first phase and a second set of switches controllable by a second phase, wherein the second phase is different from the first phase.

Example 17

The system of example 16, wherein the first phase is substantially 180 degrees out of phase relative to the second phase.

Example 18

The system of example 16, wherein the charge compensation circuit comprises a first switch of the first set of switches and a second switch, wherein the second switch is controllable by a third phase, wherein the second phase overlaps the third phase.

Example 19

The system of example 18, wherein the first switch is coupled to a node that provides a common mode voltage.

Example 20

The system of example 19, wherein the common mode voltage is half a supply voltage.

All features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a switched capacitor integrator having an input and an output, wherein the switched capacitor integrator comprises switches and capacitors, wherein the switches include a first set of switches controllable by a first phase and a second set of switches controllable by a second phase, and wherein the first phase is substantially 180 degrees out of phase relative to the second phase; and
a charge compensation path coupled to the input and the output, wherein the charge compensation path comprises a first switch of the first set of switches and a second switch, wherein the second switch is controllable by a third phase, wherein the second phase overlaps the third phase, wherein the first switch is coupled to a node that is to provide a common mode voltage, and wherein the common mode voltage is substantially half a supply voltage.

2. The apparatus of claim 1, wherein the charge compensation path comprises a capacitor coupled to the output of the switched capacitor integrator.

3. The apparatus of claim 1, wherein the common mode voltage is generated by one of a voltage divider, a resistor divider, or a bias generation circuit.

4. The apparatus of claim 1, wherein the common mode voltage is a programmable voltage.

5. The apparatus of claim 1, wherein the switched capacitor integrator includes:
a third switch of the first set of switches, wherein the third switch is coupled to the input;
a fourth switch of the second set of switches, wherein the fourth switch is coupled to the third switch, and wherein the third switch is coupled to a node that provides a common mode voltage; and
a first capacitor coupled to the third switch and the fourth switch.

6. The apparatus of claim 5, wherein the switched capacitor integrator includes:
a fifth switch of the first set of switches, wherein the fifth switch is coupled to the first capacitor, wherein the fifth switch is coupled to the node that provides the common mode voltage; and
a sixth switch of the second set of switches, wherein the sixth switch is coupled to the fifth switch and the first capacitor.

7. The apparatus of claim 6 comprises an amplifier having an input coupled to the sixth switch, and an output coupled to the output of the switched capacitor integrator.

8. The apparatus of claim 7 comprises a second capacitor coupled to the input of the amplifier and the output of the amplifier.

9. The apparatus of claim 8 comprises a seventh switch of the second set of switches, wherein the seventh switch is coupled to the output of the amplifier, the charge compensation path, and a load capacitor.

10. An apparatus comprising:
a switched capacitor integrator having an input and an output, wherein the switched capacitor integrator comprises switches and capacitors, and an operational transconductance amplifier, and wherein the operational transconductance amplifier is coupled to the output; and
a charge compensation circuit coupled to the input and the output, wherein the charge compensation circuit provides additional charge at the output, wherein the additional charge is proportional to an input voltage on the input, wherein the additional charge is provided via a capacitor, wherein the charge compensation circuit comprises a switch which is coupled to a node that is to provide a common mode voltage, and wherein the common mode voltage is substantially half a supply voltage.

11. The apparatus of claim 10, wherein the switches include a first set of switches controllable by a first phase and a second set of switches controllable by a second phase, and wherein the first phase is substantially 180 degrees out of phase relative to the second phase.

12. The apparatus of claim 11, wherein the switch is a first switch of the first set of switches, wherein the charge compensation circuit comprises a second switch, wherein the second switch is controllable by a third phase, and wherein the second phase overlaps the third phase.

13. The apparatus of claim 10, wherein the common mode voltage is generated by one of a voltage divider, a resistor divider, or a bias generation circuit.

14. The apparatus of claim 10, wherein the common mode voltage is a programmable voltage.

15. A system comprising:
a memory to store one or more instructions;
a processor circuitry to execute the one or more instructions; and
a communication interface to allow the processor circuitry to communicate with another device, wherein the processor circuitry includes a second-order delta-sigma modulator, which comprises:
a switched capacitor integrator having an input and an output, wherein the switched capacitor integrator comprises switches and capacitors, and an operational transconductance amplifier, and wherein the operational transconductance amplifier is coupled to the output; and
a charge compensation circuit coupled to the input and the output, wherein the charge compensation circuit provides additional charge at the output, wherein the additional charge is proportional to an input voltage on the input, wherein the additional charge is provided via a capacitor, wherein the charge compensation circuit comprises a switch which is coupled to a node that is to provide a common mode voltage, and wherein the common mode voltage is substantially half a supply voltage.

16. The system of claim 15, wherein the switches include a first set of switches controllable by a first phase and a second set of switches controllable by a second phase, and wherein the second phase is different from the first phase.

17. The system of claim 16, wherein the first phase is substantially 180 degrees out of phase relative to the second phase.

18. The system of claim 16, wherein the switch is a first switch, wherein the first switch is part of the first set of switches, wherein the charge compensation circuit comprises a second switch, wherein the second switch is controllable by a third phase, and wherein the second phase overlaps the third phase.

19. The system of claim 15, wherein the common mode voltage is generated by one of a voltage divider, a resistor divider, or a bias generation circuit.

20. The system of claim 15, wherein the common mode voltage is a programmable voltage.

\* \* \* \* \*